(12) United States Patent
Takano

(10) Patent No.: US 9,947,571 B2
(45) Date of Patent: Apr. 17, 2018

(54) PROCESSING APPARATUS, NOZZLE, AND DICING APPARATUS

(71) Applicant: Kabushiki Kaisha Toshiba, Minato-ku, Tokyo (JP)

(72) Inventor: Masamune Takano, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/928,747

(22) Filed: Oct. 30, 2015

(65) Prior Publication Data
US 2016/0141200 A1 May 19, 2016

(30) Foreign Application Priority Data

Nov. 14, 2014 (JP) .................. 2014-231876
Nov. 14, 2014 (JP) .................. 2014-231877
Jan. 16, 2015 (JP) .................. 2015-006812

(51) Int. Cl.
B24C 3/18 (2006.01)
B24C 1/04 (2006.01)
B24C 3/22 (2006.01)
H01L 21/687 (2006.01)
H01L 21/67 (2006.01)
B23K 26/364 (2014.01)
(Continued)

(52) U.S. Cl.
CPC ...... H01L 21/68764 (2013.01); B23K 26/364 (2015.10); B23K 26/402 (2013.01); B24C 1/003 (2013.01); B24C 1/045 (2013.01); B24C 3/18 (2013.01); H01L 21/67092 (2013.01); B23K 2203/56 (2015.10)

(58) Field of Classification Search
CPC ........ H01L 21/68764; H01L 21/67092; B23K 26/364; B23K 26/26402; B24C 1/003; B24C 1/045; B24C 3/18
See application file for complete search history.

(56) References Cited

U.S. PATENT DOCUMENTS 5,390,450 A * 2/1995 Goenka ............... B24C 1/003
451/102
5,545,073 A * 8/1996 Kneisel ............... B05B 1/005
134/7
(Continued)

FOREIGN PATENT DOCUMENTS

CN 1502118 A 6/2004
JP S52-27267 A 3/1977
(Continued)

OTHER PUBLICATIONS

Non-Final Office Action received in U.S. Appl. No. 14/928,482 dated Sep. 28, 2016.
(Continued)

Primary Examiner — Dung Van Nguyen
(74) Attorney, Agent, or Firm — White & Case LLP

(57) ABSTRACT

A processing apparatus of an embodiment includes a stage that can have a sample placed thereon, a rotation mechanism that rotates the stage, a nozzle that injects a substance onto the sample, a movement mechanism that moves the stage and the nozzle in a relative manner in a direction perpendicular to the rotation axis of the stage; and a control unit that controls the movement mechanism.

5 Claims, 32 Drawing Sheets

(51) Int. Cl.
  *B23K 26/402* (2014.01)
  *B24C 1/00* (2006.01)
  *B23K 103/00* (2006.01)

(56) References Cited

U.S. PATENT DOCUMENTS

| | | | |
|---|---|---|---|
| 5,558,110 | A | 9/1996 | Williford, Jr. |
| 5,679,062 | A * | 10/1997 | Goenka ............... B24C 5/04 451/102 |
| 5,762,538 | A | 6/1998 | Shaffer |
| 5,888,883 | A | 3/1999 | Sasaki et al. |
| 5,997,653 | A | 12/1999 | Yamasaka |
| 6,012,968 | A | 1/2000 | Lofaro |
| 6,247,479 | B1 | 6/2001 | Taniyama et al. |
| 6,383,331 | B1 | 5/2002 | Sumnitsch |
| 6,419,566 | B1 * | 7/2002 | Palmisano ............ B24C 1/003 451/102 |
| 6,500,758 | B1 | 12/2002 | Bowers |
| 6,565,920 | B1 * | 5/2003 | Endisch ............. B08B 7/0092 134/33 |
| 6,653,210 | B2 | 11/2003 | Choo et al. |
| 6,719,612 | B2 | 4/2004 | Visaisouk et al. |
| 6,790,289 | B2 | 9/2004 | Takase et al. |
| 6,960,119 | B1 * | 11/2005 | Said ................... B24C 1/003 451/39 |
| 7,790,578 | B2 | 9/2010 | Furui |
| 7,806,076 | B2 | 10/2010 | Yamamoto et al. |
| 7,901,514 | B2 | 3/2011 | Nakamura et al. |
| 8,043,469 | B2 | 10/2011 | Nakamori et al. |
| 8,113,221 | B2 | 2/2012 | Nanba et al. |
| 8,147,617 | B2 | 4/2012 | Sekiguchi et al. |
| 9,728,459 | B2 | 8/2017 | Kaempf |
| 2002/0168924 | A1 | 11/2002 | Visaisouk et al. |
| 2003/0121511 | A1 * | 7/2003 | Hashimura ......... H01L 21/3043 125/2 |
| 2004/0140298 | A1 * | 7/2004 | Widmann ............ B08B 7/0014 219/121.69 |
| 2004/0140300 | A1 * | 7/2004 | Yoshikawa ......... B23K 26/123 219/121.84 |
| 2005/0106782 | A1 * | 5/2005 | Genda ............... B23K 26/18 438/118 |
| 2006/0045511 | A1 | 3/2006 | Genda |
| 2006/0073677 | A1 | 4/2006 | Nakamura |
| 2006/0262481 | A1 | 11/2006 | Mashiko |
| 2006/0276006 | A1 | 12/2006 | Yang et al. |
| 2007/0114488 | A1 | 5/2007 | Jackson |
| 2008/0006302 | A1 * | 1/2008 | Araki ................. H01L 21/0206 134/26 |
| 2008/0213978 | A1 | 9/2008 | Henry et al. |
| 2010/0044873 | A1 | 2/2010 | Kameyama |
| 2010/0136766 | A1 | 6/2010 | Sakamoto et al. |
| 2011/0265815 | A1 | 11/2011 | Mitake et al. |
| 2012/0247504 | A1 | 10/2012 | Nasr et al. |
| 2012/0322240 | A1 | 12/2012 | Holden et al. |
| 2013/0084658 | A1 | 4/2013 | Vaupel et al. |
| 2013/0084659 | A1 | 4/2013 | Martens et al. |
| 2013/0267076 | A1 | 10/2013 | Lei et al. |
| 2014/0020846 | A1 | 1/2014 | Hirakawa et al. |
| 2014/0261570 | A1 | 9/2014 | Orii et al. |
| 2015/0020850 | A1 | 1/2015 | Kato et al. |
| 2015/0034900 | A1 | 2/2015 | Aihara |
| 2015/0104929 | A1 | 4/2015 | Lei et al. |
| 2015/0303112 | A1 | 10/2015 | Kaempf |
| 2016/0141209 | A1 | 5/2016 | Takano |
| 2016/0218037 | A1 | 7/2016 | Takano |
| 2017/0032984 | A1 | 2/2017 | Ito et al. |
| 2017/0084480 | A1 | 3/2017 | Mizutani et al. |
| 2017/0090291 | A1 | 3/2017 | Yoshihara et al. |

FOREIGN PATENT DOCUMENTS

| | | |
|---|---|---|
| JP | S63-156661 A | 6/1988 |
| JP | H08-274060 A | 10/1996 |
| JP | 2000-334662 A | 12/2000 |
| JP | 2001-044143 A | 2/2001 |
| JP | 2003-031362 A | 1/2003 |
| JP | 2003-535483 A | 11/2003 |
| JP | 2005-044920 A | 2/2005 |
| JP | 3636835 B2 | 4/2005 |
| JP | 2006-073690 A | 3/2006 |
| JP | 2006-108273 A | 4/2006 |
| JP | 2007-142277 A | 6/2007 |
| JP | 2007-250620 A | 9/2007 |
| JP | 2007-258640 A | 10/2007 |
| JP | 2008-141135 A | 6/2008 |
| JP | 2009-061516 A | 3/2009 |
| JP | 2013-006258 A | 1/2013 |
| JP | 2013-222822 A | 10/2013 |
| JP | 2014-039976 A | 3/2014 |
| JP | 2014-090127 A | 5/2014 |
| JP | 2014-135393 A | 7/2014 |
| JP | 2014-159052 A | 9/2014 |
| JP | 2014-522731 A | 9/2014 |
| KR | 10-2005-0065748 A | 6/2005 |
| KR | 10-2006-0120475 A | 11/2006 |
| KR | 10-2013-0115681 A | 10/2013 |
| TW | 200529308 A | 9/2005 |
| TW | 200641985 A | 12/2006 |
| TW | 200811942 A | 3/2008 |
| TW | 201312676 A | 3/2013 |
| TW | 201448018 A | 12/2014 |
| TW | 201507020 A | 2/2015 |
| WO | 2002092283 A2 | 11/2002 |
| WO | 2013011705 A1 | 1/2013 |
| WO | 2014052445 A1 | 4/2014 |
| WO | 2014079708 A1 | 5/2014 |

OTHER PUBLICATIONS

Korean Office Action dated Jun. 2, 2016 by the Korean Intellectual Property Office (KIPO) in counterpart Korean patent application 10-2015-0113668 along with English translation thereof.

* cited by examiner

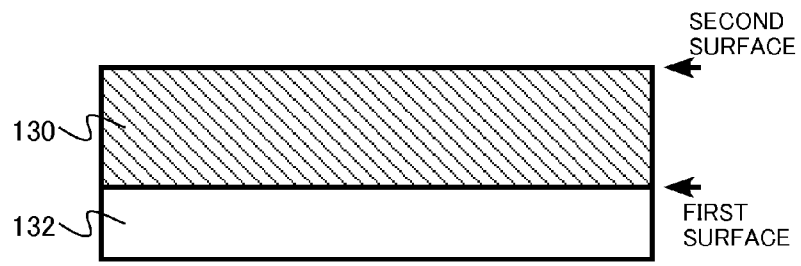
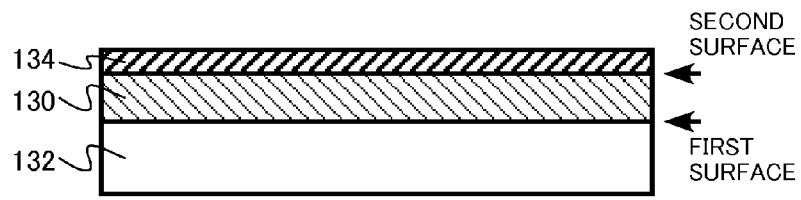
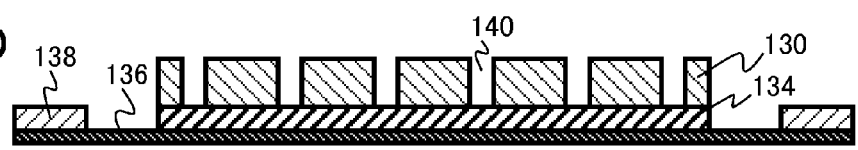
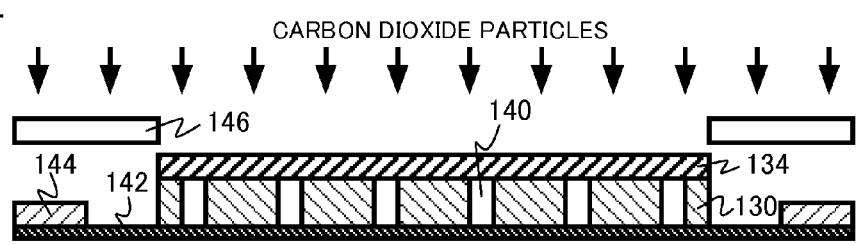

FIG.26B

CARBON DIOXIDE PARTICLES

CARBON DIOXIDE PARTICLES

PROCESSING APPARATUS, NOZZLE, AND DICING APPARATUS

CROSS-REFERENCE TO RELATED APPLICATION

This application is based upon and claims the benefit of priority from Japanese Patent Application No. 2014-231877, filed on Nov. 14, 2014, Japanese Patent Application No. 2014-231876, filed on Nov. 14, 2014, and Japanese Patent Application No. 2015-006812, filed on Jan. 16, 2015, the entire contents of which are incorporated herein by reference.

FIELD

Embodiments described herein relate generally to a processing apparatus, a nozzle, and a dicing apparatus.

BACKGROUND

Semiconductor devices formed on a semiconductor substrate such as a wafer are divided into semiconductor chips by dicing along dicing regions formed on the semiconductor substrate. In a case where a metal film to be the electrodes of the semiconductor devices, or a resin film such as a die bonding film is formed on one surface of the semiconductor substrate, the metal film or the resin film in the dicing regions also needs to be removed at the time of dicing.

As a method of removing the metal film or the resin film, there is a method of removing a metal film or a resin film at the same time as a semiconductor substrate by blade dicing, for example. In this case, shape abnormalities such as protrusions (burrs) are likely to occur on the metal film or the resin film. Where the metal film or the resin film has shape abnormalities, the semiconductor chips might fail the external appearance test, or junction defects might occur between beds and the semiconductor chips. As a result, the production yield becomes lower.

BRIEF DESCRIPTION OF THE DRAWINGS

FIGS. 12A, 12B, 12C, 12D, 12E, 12F, and 12G are schematic cross-sectional diagrams showing the procedures in a device manufacturing method according to the tenth embodiment;

FIGS. 26A, 26B, 26C, and 26D are schematic cross-sectional diagrams showing the procedures in an example of a dicing method according to the nineteenth embodiment;

DETAILED DESCRIPTION

Figure 1A:
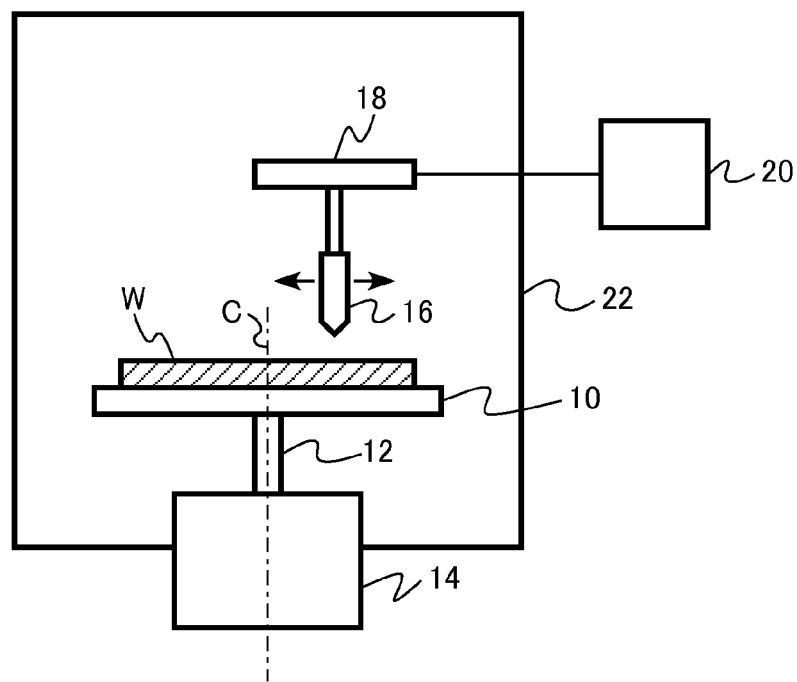
FIGS. 1A and 1B are schematic views of a processing apparatus according to a first embodiment.

A processing apparatus of an embodiment includes: a stage that can have a sample placed thereon; a rotation mechanism that rotates the stage; a nozzle that injects a substance onto the sample; a movement mechanism that moves the stage and the nozzle in a relative manner in a direction perpendicular to the rotation axis of the stage; and a control unit that controls the movement mechanism.

The following is a description of embodiments, with reference to the accompanying drawings. In the description below, like and similar components are denoted by like reference numerals, and explanation of components described once will not be repeated.

(First Embodiment)

A processing apparatus of this embodiment includes: a stage that can have a sample placed thereon; a rotation mechanism that rotates the stage; a nozzle that injects a substance onto the sample; a movement mechanism that moves the stage and the nozzle in a relative manner in a direction perpendicular to the rotation axis of the stage; and a control unit that controls the movement mechanism. The processing apparatus of this embodiment includes: the stage that can have a sample placed thereon; and the nozzle that divides the sample by injecting a substance onto the sample, the substance removing a metal film or a resin film provided on the sample.

The processing apparatus of this embodiment is a semiconductor manufacturing apparatus to be used in dicing a semiconductor substrate, for example. For example, the processing apparatus of this embodiment is used in a case where a metal film provided on one surface of a semiconductor substrate and is to be the electrodes or the like of semiconductor devices is removed at the time of dicing.

In this embodiment, an example case where the substance to be injected onto the metal film is particles containing carbon dioxide is described. The particles containing carbon dioxide (hereinafter also referred to simply as carbon dioxide particles) are particles containing carbon dioxide as a principal component. In addition to carbon dioxide, the particles may contain inevitable impurities, for example.

Figure 1B:
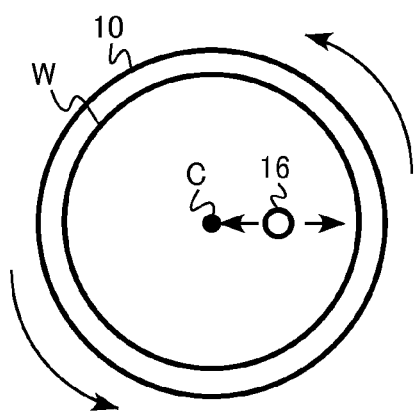

FIGS. 1A and 1B are schematic views of the processing apparatus of this embodiment. FIG. 1A is a schematic diagram including a cross-section of the apparatus. FIG. 1B is a top view of the stage.

The semiconductor manufacturing apparatus of this embodiment includes a stage 10, a support shaft 12, a rotation mechanism 14, a nozzle 16, a movement mechanism 18, a control unit 20, and a processing chamber 22.

The stage 10 is designed so that the sample W to be process can be placed thereon. For example, a semiconductor wafer bonded to a dicing sheet secured to a dicing frame is placed on the stage 10.

The stage 10 is secured to the support shaft 12. The rotation mechanism 14 rotates the stage 10. The rotation mechanism 14 includes a motor and a bearing that rotatably holds the support shaft 12, for example. The stage 10 is rotated about a rotation axis C by the rotation mechanism 14.

Carbon dioxide particles for removing the metal film are injected from the nozzle 16. As the metal film is removed by the injected carbon dioxide particles, the sample W is divided, for example. The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The nozzle 16 is connected to a liquefied carbon dioxide tank (not shown), for example. The carbon dioxide particles are generated by adiabatically expanding and solidifying the liquefied carbon dioxide in the tank. The nozzle 16 is connected to a nitrogen gas supply source (not shown), for example. The generated carbon dioxide particles, together with a nitrogen gas, for example, are injected from the nozzle 16 toward the sample W placed on the stage 10.

The diameter of the nozzle 16 is not smaller than φ1 mm and not greater than φ3 mm, for example. The distance between the nozzle 16 and the surface of the sample W is not shorter than 10 mm and not longer than 20 mm, for example.

As indicated by arrows in FIGS. 1A and 1B, the movement mechanism 18 linearly moves the stage 10 and the nozzle 16 in a relative manner in a direction perpendicular to the rotation axis C of the stage 10. For example, the nozzle 16 is moved so as to scan between the rotation axis C of the stage 10 and the edge of the sample W. In the case illustrated in FIGS. 1A and 1B, the nozzle 16, not the stage 10, is moved by the movement mechanism 18.

The movement mechanism 18 is not particularly limited, as long as it can linearly scan the nozzle 16 relative to the stage 10. For example, a belt-driven movement mechanism formed with a combining of a belt, a pulley, and a motor for rotating the pulley is used. Alternatively, a combination of a rack-and-pinion mechanism and a motor is used, for example. Also, a linear motor may be used, for example.

The movement mechanism 18 may move the stage 10 relative to a fixed nozzle 16 instead of the nozzle 16.

The control unit 20 controls the movement mechanism 18. The control unit 20 controls the scan range of the nozzle 16 on the stage 10, the velocity of the nozzle 16 relative to the stage 10, and the like to become desired values, for example. The control unit 20 may be hardware such as a circuit board, or may be a combination of hardware and software such as a control program stored in a memory. The control unit 20 may control the movement mechanism 18 in synchronization with the rotation mechanism 14. The control unit 20 also moves the stage 10 and the nozzle 16 in a relative manner in a direction parallel to the surface of the stage 10, for example.

A housing 22 houses and covers the stage 10, the nozzle 16, the movement mechanism 18, and the like. The housing 22 protects the stage 10, the nozzle 16, the movement mechanism 18, and the like, and prevents the processing on the sample W from being affected by the external environment.

Next, an example of a method of manufacturing a semiconductor device using the semiconductor manufacturing apparatus of this embodiment is described. An example case where the semiconductor device to be manufactured is a vertical power MOSFET (Metal Oxide Semiconductor Field Effect Transistor) that has metal electrodes on both surfaces of the semiconductor device and includes silicon (Si) is described below.

FIGS. 2A, 2B, 2C, 2D, 2E, 2F, and 2G are schematic cross-sectional diagrams showing the procedures in a device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a semiconductor substrate) 30 having a first surface (hereinafter referred to the front surface) and a second surface (hereinafter also referred to as the back surface). A protection film is then formed on the uppermost layer. The protection film is an inorganic insulating film such as a resin film made of polyimide or the like, a silicon nitride film, or a silicon oxide film. The silicon substrate 30 is preferably exposed through the surface of a dicing region formed on the front surface side.

Figure 2A:
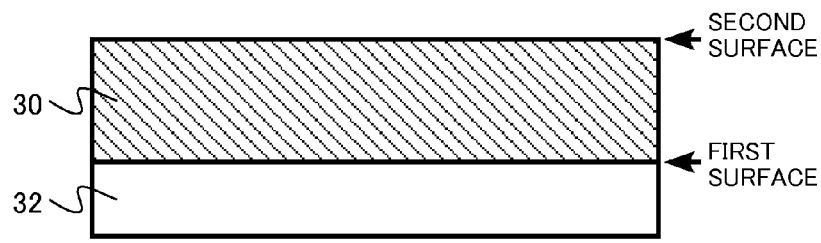
FIGS. 2A, 2B, 2C, 2D, 2E, 2F, and 2G are schematic cross-sectional diagrams showing the procedures in a device manufacturing method according to the first embodiment.

A supporting substrate 32 is then bonded to the front surface side of the silicon substrate 30 (FIG. 2A). The supporting substrate 32 is quartz glass, for example.

Figure 2B:
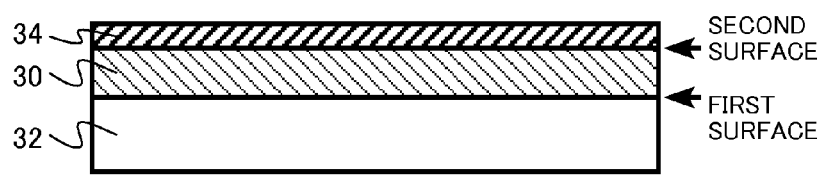

The back surface side of the silicon substrate 30 is ground, so that the silicon substrate 30 becomes thinner. A metal film 34 is then formed on the back surface side of the silicon substrate 30 (FIG. 2B).

The metal film 34 is the drain electrode of the MOSFET. The metal film 34 is formed with stacked films of different kinds of metals, for example. The metal film 34 is formed with stacked films of aluminum, titanium, nickel, and gold in this order from the back surface side of the silicon substrate 30, for example. The metal film 34 is formed by a sputtering technique, for example.

Figure 2C:

A resin sheet 36 is then bonded to the back surface side of the silicon substrate 30. The resin sheet 36 is a so-called dicing sheet. The resin sheet 36 is secured by a metal frame 38, for example. The resin sheet 36 is attached to the front surface of the metal film 34. The supporting substrate 32 is then removed from the silicon substrate 30 (FIG. 2C).

Figure 2D:
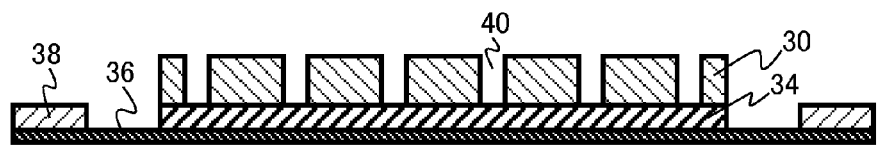

Grooves 40 are then formed in the silicon substrate 30 so that the metal film 34 on the back surface side is exposed through the front surface side along the dicing region formed on the front surface side of the silicon substrate 30 (FIG. 2D). Here, the dicing region is a reserved region having a predetermined width for dividing semiconductor chips by dicing, and is provided on the front surface side of the silicon substrate 30. The patterns of the semiconductor devices are not formed in the dicing region. The dicing region is provided on the front surface side of the silicon substrate 30, and is formed in a grid-like shape, for example.

The trenchs 40 are formed by plasma etching, for example. The plasma etching is a so-called Bosch process in which an isotropic etching step using F-based radicals, a protection film forming step using $CF_4$-based radicals, and an anisotropic etching step using F-based ions are repeated, for example.

The trenchs 40 are preferably formed by overall etching, with the mask being the protection film on the front surface side of the silicon substrate 30. This method does not involve lithography. Accordingly, the manufacturing process can be simplified, and the costs can be lowered.

Figure 2E:
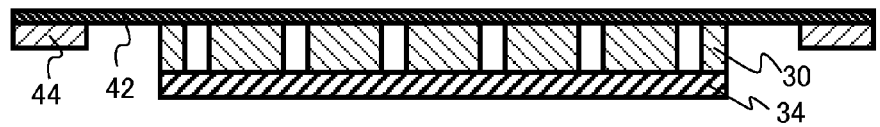

A resin sheet 42 is then bonded to the front surface side of the silicon substrate 30. The resin sheet 42 is a so-called dicing sheet. The resin sheet 42 is secured by a metal frame 44, for example. The resin sheet 42 is attached to the surfaces of the protection film and the metal electrodes on the front surface side. The resin sheet 36 on the back surface side is then removed (FIG. 2E).

Figure 2F:
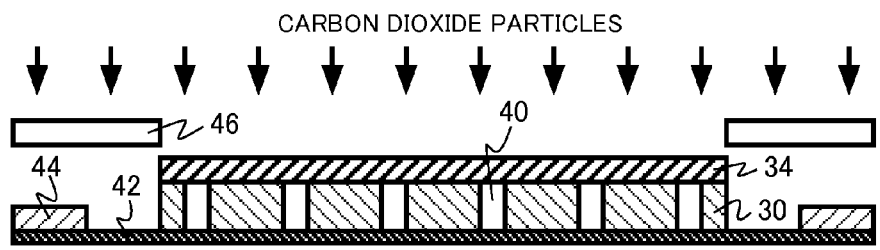

With the semiconductor manufacturing apparatus shown in FIGS. 1A and 1B, carbon dioxide particles are then injected onto the metal film 34 from the back surface side of the silicon substrate 30 (FIG. 2F). First, the frame 44 is placed on the stage 10 so that the resin sheet 42 is located on the surface of the stage 10 (FIGS. 1A and 1B). The stage 10 is then rotated by the rotation mechanism 14. While the nozzle 16 is linearly reciprocated in a direction perpendicular to the rotation axis of the stage 10 by the movement mechanism 18, carbon dioxide particles are injected from the nozzle 16.

Figure 2G:

As the carbon dioxide particles are injected, the metal film 34 on the back surface side of the trenchs 40 is removed. As the metal film 34 is removed, the silicon substrate 30 is divided into MOSFETs. By virtue of the carbon dioxide particles, the metal film 34 is scraped off into the trenchs 40, which are hollow portions in physical terms (FIG. 2G).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are ejected together with a nitrogen gas from the nozzle 16, and are injected onto the metal film 34. The mean particle size of the carbon dioxide particles is preferably not smaller than 10 μm and not greater than 200 μm. The mean particle size of the carbon dioxide particles can be determined by taking an image of the carbon dioxide particles ejected from the nozzle 16 with a high-speed camera, and measuring the lengths of the particles shown in the taken image, for example. The particle size of one particle is the mean value of the lengths of the long side and the short side of the rectangle circumscribed to the particle shown in the image, for example. The particle sizes of the particles are the particle sizes measured immediately after the particles are ejected from the nozzle 16. The spot diameter on the surface of the metal film 34 when the carbon dioxide particles are injected onto the metal film 34 is preferably not smaller than φ3 mm and not greater than φ10 mm, for example.

When the carbon dioxide particles are injected to remove the metal film 34, the region of the resin sheet 42 is preferably covered with a mask 46, as shown in FIG. 2F. As the region of the resin sheet 42 is covered with the mask 46, the resin sheet 42 can be prevented from coming off the frame 44 due to the impact caused by the carbon dioxide particles, for example. The mask 46 is made of a metal, for example.

After that, the resin sheet 42 on the front surface side of the silicon substrate 30 is removed. As a result, divided MOSFETs are obtained.

Next, the functions and the effects of the processing apparatus of this embodiment are described.

In a case where the metal film 34 is also formed on the back surface side of the silicon substrate 30 as in a vertical MOSFET, the metal film 34 on the back surface side in the dicing region also needs to be removed at the time of dicing. In a case where the semiconductor substrate 30 and the metal film 34 are simultaneously removed from the front surface side by blade dicing, for example, the portions of the metal film 34 at the edges of the trenchs 40 in the dicing region curl toward the back surface side, and so-called burrs are formed.

If burrs are formed in the metal film 34, there is a possibility that the semiconductor chips will fail the external appearance test, and will not be turned into products, for example. Also, when the semiconductor chips and beds are joined with joining members such as solders, there is a possibility that soldering defects will be formed due to degraded adhesive properties at portions with burrs.

In the dicing using the semiconductor manufacturing apparatus of this embodiment, after the trenchs 40 are formed along the dicing region of the silicon substrate 30, carbon dioxide particles are injected onto the metal film 34 from the back surface side, so that the portions of the metal film 34 located over the trenchs 40 are removed. As the removed portions of the metal film 34 are scraped off into the trenchs 40 in the form of hollows, formation of burrs can be restrained. Only the portions of the metal film 34 at the portions corresponding to the trenches 40 can be removed in a self-aligning manner.

It is considered that the portions of the metal film 34 located over the trenchs 40 are removed mainly by physical impact caused by carbon dioxide particles. In addition to that, it is considered that, as the metal film 34 is rapidly cooled by the low-temperature carbon dioxide particles, and the force generated by gasification and expansion of the carbon dioxide particles that have collided with the metal film 34 is applied, the effect to remove the metal film 34 by physical impact is increased.

Furthermore, in the semiconductor manufacturing apparatus of this embodiment, carbon dioxide particles are injected onto a sample placed on the rotating stage 10. Accordingly, carbon dioxide particles can be injected more evenly onto the surface of the sample than in a case where carbon dioxide particles are injected onto a sample placed on a fixed stage. Thus, the metal film 34 can be evenly removed.

Also, as carbon dioxide particles are injected onto a rotating sample, the velocity of the sample is added to the impact velocity of the carbon dioxide particles. Accordingly, the velocity at which the carbon dioxide particles collide with the metal film 34 becomes higher. Thus, the metal film 34 can be removed with high efficiency.

In a case where a semiconductor device including a resin film in place of the metal film on the back surface side of the silicon substrate 30 is manufactured, the semiconductor manufacturing apparatus of this embodiment can be used. In this case, carbon dioxide particles are injected, so that the resin film, instead of the metal film, is removed.

As described above, with the processing apparatus of this embodiment, shape abnormalities in the metal film or the resin film at the time of dicing can be restrained. Also, the metal film or the resin film can be uniformly and efficiently removed at the time of dicing.

(Second Embodiment)

A processing apparatus of this embodiment is the same as the processing apparatus of the first embodiment, except that the control unit controls the velocity of the relative movement of the stage and the nozzle to become lower as the distance from the rotation axis of the stage to the nozzle becomes longer. Therefore, the same explanations as those in the first embodiment will not be repeated.

Figure 3A:
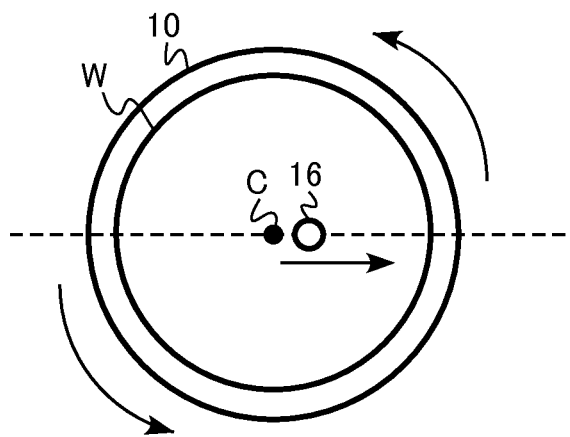
FIGS. 3A and 3B are diagrams for explaining the functions of a processing apparatus according to a second embodiment.
Figure 3B:
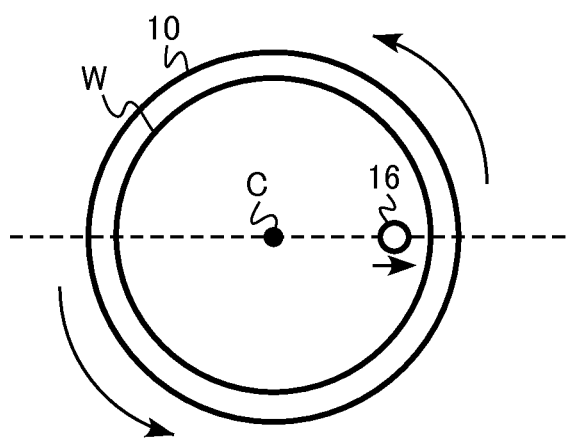

FIGS. 3A and 3B are diagrams for explaining the functions of the processing apparatus of this embodiment. FIG. 3A is a diagram illustrating a case where the distance from the rotation axis C of the stage 10 to the nozzle 16 is short. FIG. 3B is a diagram illustrating a case where the distance from the rotation axis C of the stage 10 to the nozzle 16 is long.

In this embodiment, in a case where the distance from the rotation axis C of the stage 10 to the nozzle 16 is short as shown in FIG. 3A, the moving velocity of the nozzle 16 is increased. In a case where the distance from the rotation axis C of the stage 10 to the nozzle 16 is long as shown in FIG. 3B, the moving velocity of the nozzle 16 is decreased. The lengths of arrows shown in FIGS. 3A and 3B indicate the difference between the moving velocities.

If the moving velocity of the nozzle 16 is fixed, regardless of the distance from the rotation axis C of the stage 10 to the nozzle 16, the amount of carbon dioxide particles to be injected per unit area of a sample W located in a region at a long distance from the rotation axis C might be smaller than the amount of carbon dioxide particles to be injected per unit area of the sample W located in a region at a short distance from the rotation axis C.

According to this embodiment, the amount of carbon dioxide particles to be injected per unit area of a sample W can be made substantially uniform, regardless of the distance from the rotation axis C. Accordingly, the evenness of the processing of the sample W can be further increased. Specifically, the evenness in removing the metal film or the resin film is increased, for example.

(Third Embodiment)

A processing apparatus of this embodiment is the same as the processing apparatus of the first embodiment, except for including a tilt mechanism that changes the angle of tilt of the nozzle with respect to the surface of the stage. Therefore, the same explanations as those in the first embodiment will not be repeated.

Figure 4A:
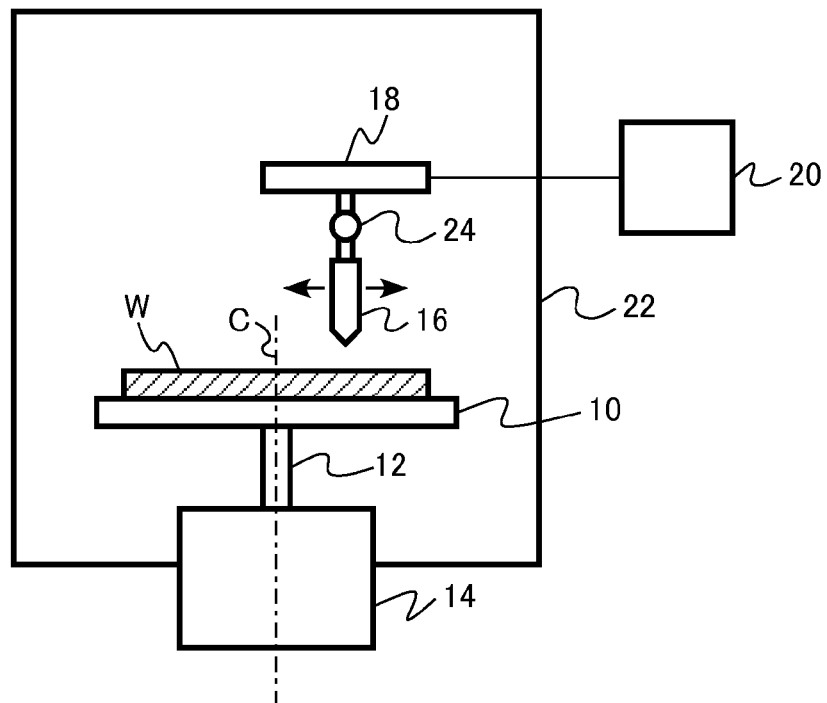
FIGS. 4A and 4B are schematic views of a processing apparatus according to a third embodiment.
Figure 4B:
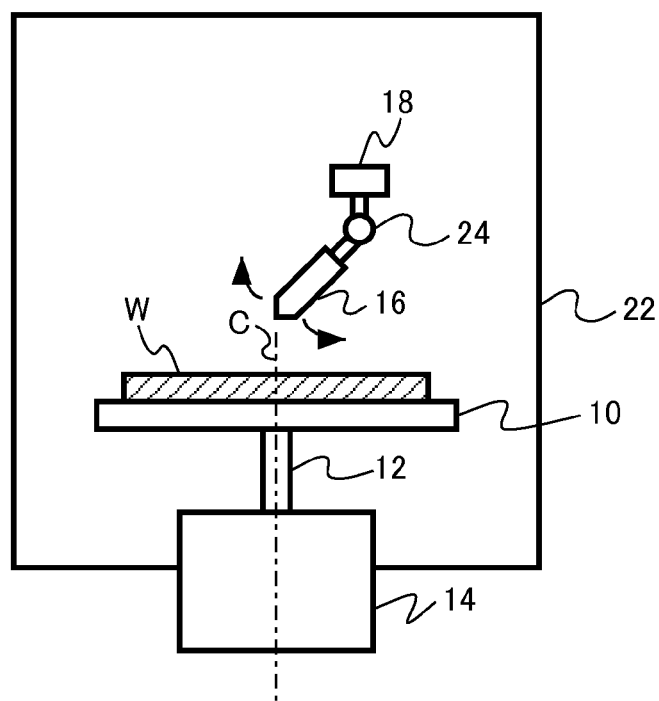

FIGS. 4A and 4B are schematic views of the processing apparatus of this embodiment. FIG. 4A is a schematic view including a cross-section of the apparatus. FIG. 4B is a schematic view including a cross-section in a direction perpendicular to the cross-section shown in FIG. 4A.

The semiconductor manufacturing apparatus of this embodiment includes a tilt mechanism 24. The tilt mechanism 24 changes the angle of tilt of the nozzle 16 with respect to the surface of the stage 10. The angle of tilt of the tilt mechanism 24 is controlled by the control unit 20, for example.

The tilt mechanism 24 is a rotational tilt mechanism formed with a combination of a rotary shaft and a stepping motor, for example. The angle of tilt of the nozzle 16 is preferably controlled so that the impact velocity of carbon dioxide particles colliding with the surface of a rotating sample W becomes higher than that in a case where the angle of tilt is 90 degrees. Specifically, the angle of tilt of the nozzle 16 is preferably set so that the orientation of the injected carbon dioxide particles on the surface of the sample W is the opposite of the orientation of the rotational movement of the surface of the sample W.

By a manufacturing method using the semiconductor manufacturing apparatus of this embodiment, carbon dioxide particles are injected onto the sample W, while the angle of tilt of the nozzle 16 with respect to the surface of the stage 10 is maintained at a smaller angle than 90 degrees, such as an angle not smaller than 15 degrees and not larger than 45 degrees.

According to this embodiment, the injecting of carbon dioxide particles has a horizontal-direction component with respect to the surface of the sample W. Therefore, the metal film or the resin film removed by the carbon dioxide particles does not easily enter the trenches for dicing. Accordingly, the removed metal film or resin film can be prevented from turning into residues in the trenches. Also, as the impact velocity of the carbon dioxide particles onto the sample W can be increased, the metal film 34 can be removed with higher efficiency. Furthermore, as the angle of tilt can be set at a desired value, an optimum processing condition for the sample W can be set.

Alternatively, the angle of tilt of the nozzle 16 with respect to the surface of the stage 10 may be fixed at a smaller angle than 90 degrees. With this structure, the metal film or the resin film removed by the carbon dioxide particles can also be prevented from entering the trenches for dicing and turning into residues in the trenchs. Also, as the impact velocity of the carbon dioxide particles onto the sample W can be increased, the metal film 34 can be removed with higher efficiency.

(Fourth Embodiment)

A processing apparatus of this embodiment is the same as the processing apparatus of the first embodiment, except for including an inlet provided in the housing and outlets provided in the housing. Therefore, the same explanations as those in the first embodiment will not be repeated.

Figure 5:
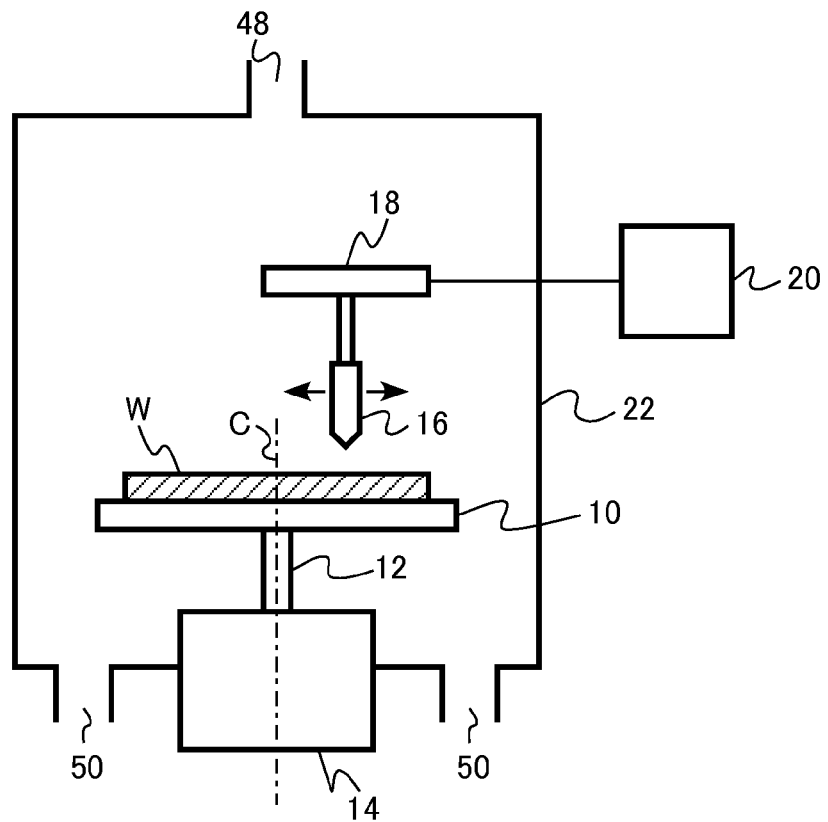
FIG. 5 is a schematic view of a processing apparatus according to a fourth embodiment.

FIG. 5 is a schematic view of the processing apparatus of this embodiment. FIG. 5 is a schematic view including a cross-section of the apparatus.

The semiconductor manufacturing apparatus of this embodiment includes an inlet 48 provided in the housing 22, and outlets 50 provided in the housing 22. The inlet 48 is provided at an upper portion of the housing 22, for example, and the outlets 50 are provided at lower portions of the housing 22, for example.

Gaseous matter such as the air or a nitrogen gas is supplied into the housing 22 through the inlet 48, and is discharged through the outlets 50. A pump (not shown) is connected to the outlets 50, for example, and exhausts the gaseous matter in the housing 22. The gaseous matter flows downward in the housing 22. Accordingly, a so-called downflow can be formed in the housing 22.

According to this embodiment, the metal film or the resin film removed by carbon dioxide particles is discharged through the outlets 50 by virtue of the flow of the gaseous matter in the housing 22. Accordingly, the removed metal film or resin film can be prevented from re-adhering to the sample W, or entering the trenches for dicing and turning into residues in the trenchs.

(Fifth Embodiment)

A processing apparatus of this embodiment is the same as the processing apparatus of the first embodiment, except that the surface of the stage tilts with respect to a plane perpendicular to the direction of gravitational force. Therefore, the same explanations as those in the first embodiment will not be repeated.

Figure 6:
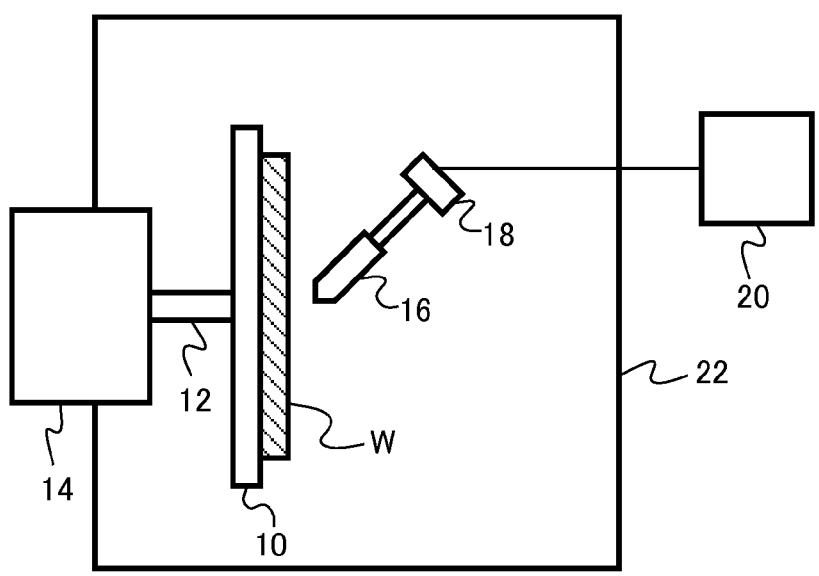
FIG. 6 is a schematic view of a processing apparatus according to a fifth embodiment.

FIG. 6 is a schematic view of the processing apparatus of this embodiment. FIG. 6 is a schematic view including a cross-section of the apparatus.

In the semiconductor manufacturing apparatus of this embodiment, the surface of the stage 10 tilts with respect to a plane perpendicular to the direction of gravitational force. In other words, the surface of the stage 10 tilts with respect to a horizontal plane. FIG. 6 illustrates a case where the surface of the stage 10 tilts at a tilt angle of 90 degrees with respect to the plane perpendicular to the direction of gravitational force.

According to this embodiment, the metal film or the resin film removed by carbon dioxide particles easily falls off in the direction of gravitational force, or downward, in the housing 22. Accordingly, the removed metal film or resin film can be prevented from re-adhering to the sample W, or entering the trenches for dicing and turning into residues in the trenchs.

So as to prevent the removed metal film or resin film from re-adhering to the sample W, the surface of the stage 10 more preferably tilts in the direction of gravitational force.

(Sixth Embodiment)

A processing apparatus of this embodiment is the same as the processing apparatus of the first embodiment, except for including a cooling mechanism that cools the atmosphere in the housing. Therefore, the same explanations as those in the first embodiment will not be repeated.

Figure 7:
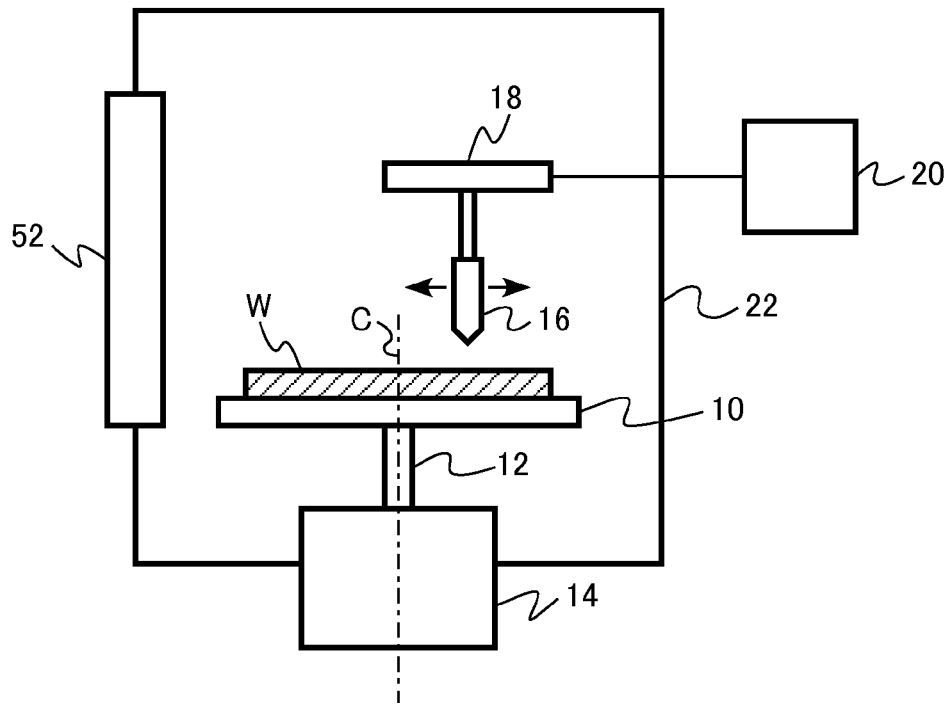
FIG. 7 is a schematic view of a processing apparatus according to a sixth embodiment.

FIG. 7 is a schematic view of the processing apparatus of this embodiment. FIG. 7 is a schematic view including a cross-section of the apparatus.

The semiconductor manufacturing apparatus of this embodiment includes a cooling mechanism 52 that cools the atmosphere in the housing 22. As the cooling mechanism 52, a heat pump is used, for example.

According to this embodiment, the temperature in the housing 22 is lowered to prevent gasification of the carbon dioxide particles injected from the nozzle. Accordingly, the efficiency of the removal of the metal film or the resin film is increased.

(Seventh Embodiment)

A processing apparatus of this embodiment is the same as the processing apparatus of the first embodiment, except for including more than one nozzle. Therefore, the same explanations as those in the first embodiment will not be repeated.

Figure 8:
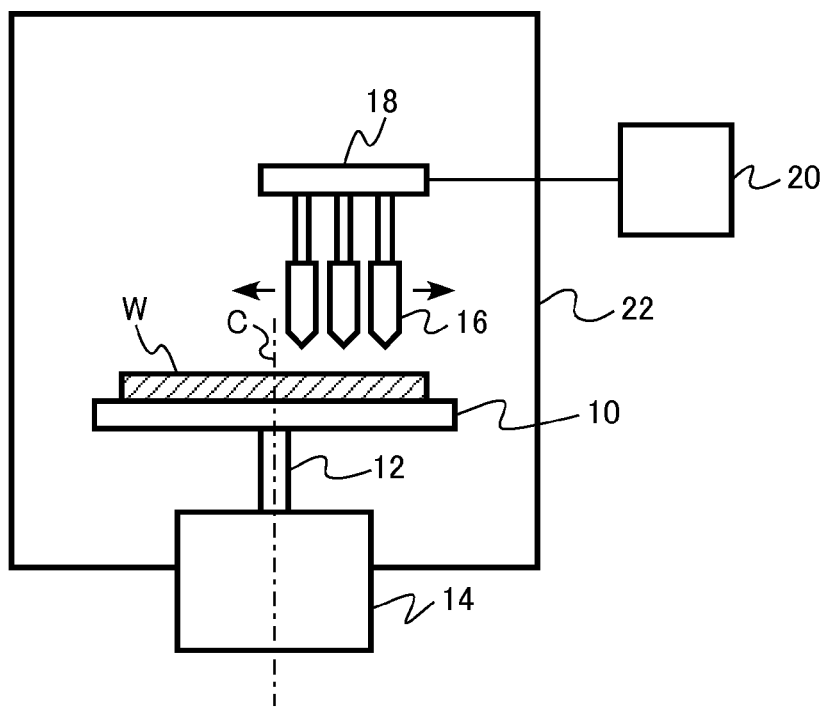
FIG. 8 is a schematic view of a processing apparatus according to a seventh embodiment.

FIG. 8 is a schematic view of the processing apparatus of this embodiment. FIG. 8 is a schematic view including a cross-section of the apparatus.

As shown in FIG. 8, the semiconductor manufacturing apparatus of this embodiment includes three nozzles 16. The number of nozzles 16 is not limited to three, as long as it is two or larger.

According to this embodiment, the productivity of processing can be increased by virtue of the nozzles 16.

(Eighth Embodiment)

A processing apparatus of this embodiment is the same as the processing apparatus of the first embodiment, except for including a movement mechanism that moves the stage and the nozzle in a relative manner in the direction of the rotation axis of the stage. Therefore, the same explanations as those in the first embodiment will not be repeated.

Figure 9:
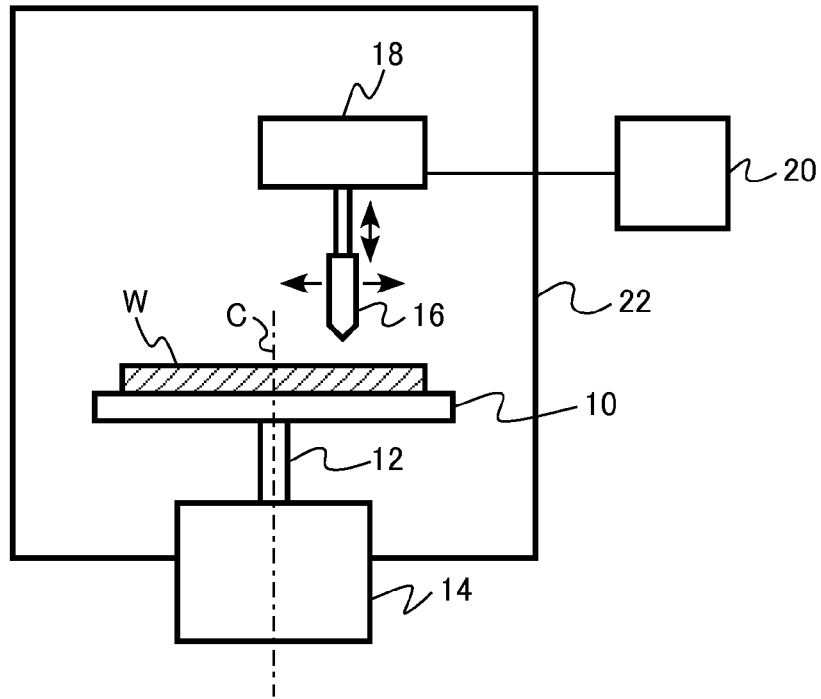
FIG. 9 is a schematic view of a processing apparatus according to an eighth embodiment.

FIG. 9 is a schematic view of the processing apparatus of this embodiment. FIG. 9 is a schematic view including a cross-section of the apparatus.

As shown in FIG. 9, the semiconductor manufacturing apparatus of this embodiment includes a movement mechanism 18 that moves the stage 10 and the nozzle 16 in a relative manner in the direction the rotation axis of the stage 10. Here, the movement mechanism 18 also has the function of moving the stage 10 and the nozzle 16 in a relative manner in a direction perpendicular to the rotation axis C of the stage 10. A movement mechanism that moves the stage 10 and the nozzle 16 in a relative manner in the direction of the rotation axis of the stage 10 may be employed as a movement mechanism independent of the movement mechanism that moves the stage 10 and the nozzle 16 in a direction perpendicular to the rotation axis C of the stage 10.

According to this embodiment, the distance between the stage 10 and the nozzle 16 can be set at a desired value, and accordingly, an optimum processing condition for the sample W can be set.

(Ninth Embodiment)

A processing apparatus of this embodiment is the same as the processing apparatus of the first embodiment, except that the surface of the stage has a recess. Therefore, the same explanations as those in the first embodiment will not be repeated.

Figure 10:
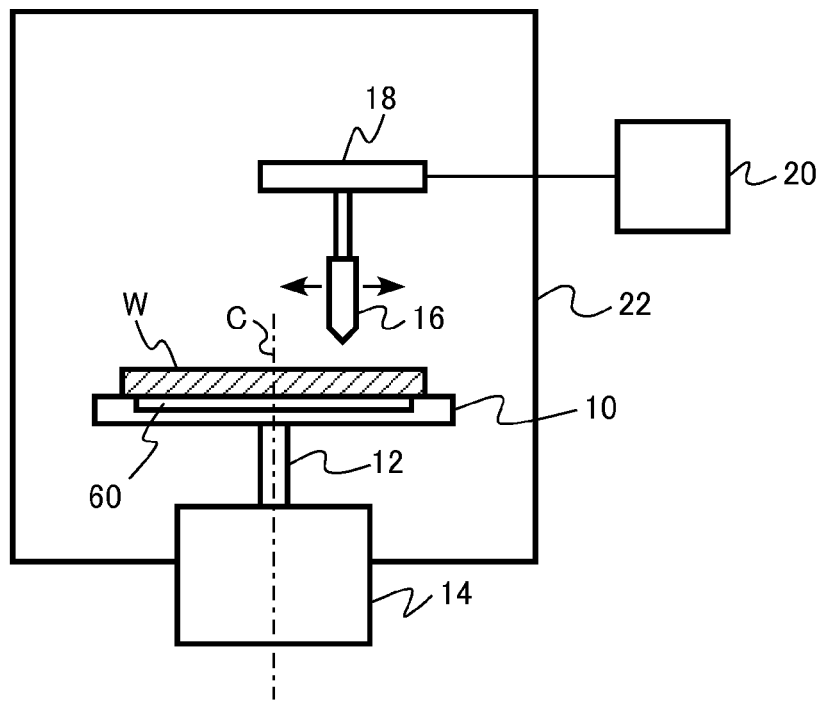
FIG. 10 is a schematic view of a processing apparatus according to a ninth embodiment.

FIG. 10 is a schematic view of the processing apparatus of this embodiment. FIG. 10 is a schematic view including a cross-section of the apparatus.

As shown in FIG. 10, in the semiconductor manufacturing apparatus of this embodiment, the surface of the stage 10 has a recess. Accordingly, when a sample W is placed on the stage 10, a space 60 is formed between the stage 10 and the sample W.

According to this embodiment, the space 60 is formed between the stage 10 and the sample W. Therefore, when dicing is performed on the silicon substrate 30, for example, MOSFETs divided by the dicing can be received by the recess of the stage. Accordingly, the step of bonding a dicing sheet to the front surface side and the back surface side can be skipped. Thus, the productivity of the processing can be increased.

In the first through ninth embodiments described above, the semiconductor devices are vertical MOSFETs. However, the semiconductor devices are not limited to vertical MOSFETs.

In the first through ninth embodiments, the metal film or the resin film is removed at the time of dicing. However, the processing apparatus of each of the embodiments can also be used in washing the surface of the semiconductor substrate, for example.

In the first through ninth embodiments, the substance to be injected is particles containing carbon dioxide. However, the substance to be injected may be some other substance, such as pressurized water, pressurized water containing abrasive grains, or particles other than carbon dioxide particles. It is also possible to use some other particles that are solid at the time of injecting from the nozzle but are gasified in an atmosphere in which a substrate is placed at ordinary temperature or the like. For example, nitrogen particles or argon particles can also be used.

Although semiconductor manufacturing apparatuses have been described as examples in the first through ninth embodiments, these embodiments can also be applied to a MEMS (Micro Electro Mechanical Systems) manufacturing apparatus.

In each of the example cases described in the first through ninth embodiments, the nozzle injects a substance to part of a sample, and the stage and the nozzle are moved in a relative manner so that the entire sample is processed. However, the nozzle can be designed to inject a substance to the entire surface of the sample so that the entire sample can be processed at once, for example. The nozzle capable of processing an entire sample at once can be produced by adjusting the nozzle diameter to the size of the sample or combining a large number of nozzles, for example.

(Tenth Embodiment)

A processing apparatus of this embodiment includes: a stage that has a surface tilting with respect to a plane perpendicular to the direction of gravitational force, and can have a sample placed on the surface; a nozzle that injects a substance onto the sample; a housing that houses the stage and the nozzle; a movement mechanism that moves the stage and the nozzle in a relative manner in a direction parallel to the surface of the stage; and a control unit that controls the movement mechanism.

The processing apparatus of this embodiment is used in dicing a semiconductor substrate, for example. For example, the processing apparatus of this embodiment is used in a case where a metal film provided on one surface of a semiconductor substrate and is to be the electrodes or the like of semiconductor devices is removed at the time of dicing.

In this embodiment, an example case where the substance to be injected onto the metal film is particles containing carbon dioxide is described. The particles containing carbon dioxide (hereinafter also referred to simply as carbon dioxide particles) are particles containing carbon dioxide as a principal component. In addition to carbon dioxide, the particles may contain inevitable impurities, for example.

Figure 11A:
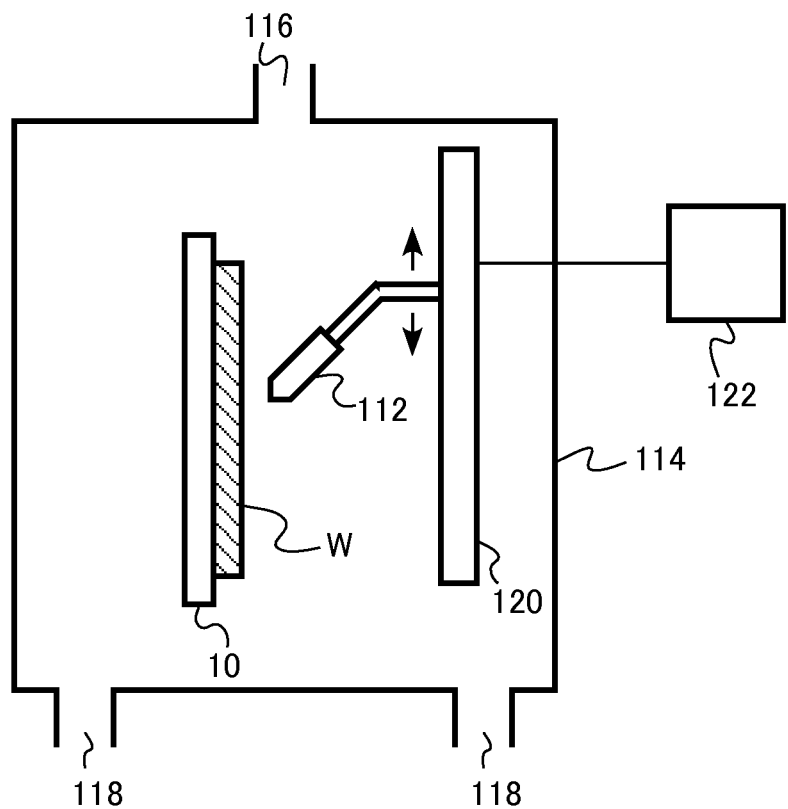
FIGS. 11A and 11B are schematic views of a processing apparatus according to a tenth embodiment.
Figure 11B:
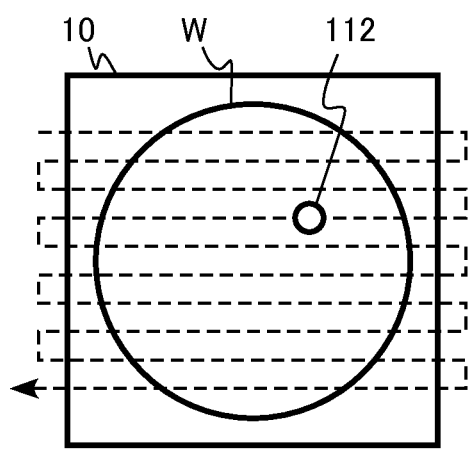

FIGS. 11A and 11B are schematic views of the processing apparatus of this embodiment. FIG. 11A is a schematic diagram including a cross-section of the apparatus. FIG. 11B is a top view of the stage.

The semiconductor manufacturing apparatus of this embodiment includes a stage 10, a nozzle 112, a housing 114, an inlet 116, outlets 118, a movement mechanism 120, and a control unit 122.

The stage 10 is designed so that the sample W to be process can be placed its surface. For example, a semiconductor wafer bonded to a dicing sheet secured to a dicing frame is placed on the stage 10.

The surface of the stage 10 tilts with respect to a plane perpendicular to the direction of gravitational force. In FIG. 11A, the surface of the stage 10 tilts at 90 degrees with respect to a plane perpendicular to the direction of gravitational force. The tilt angle of the surface of the stage 10 with respect to a plane perpendicular to the direction of gravitational force may not be 90 degrees.

Carbon dioxide particles for removing the metal film are injected from the nozzle 112. The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The nozzle 112 is connected to a liquefied carbon dioxide tank (not shown), for example. The carbon dioxide particles are generated by adiabatically expanding and solidifying the liquefied carbon dioxide in the tank. The nozzle 112 is connected to a nitrogen gas supply source (not shown), for example. The generated carbon dioxide particles, together with a nitrogen gas, for example, are injected from the nozzle 112 toward the sample W placed on the stage 10.

The diameter of the nozzle 112 is not smaller than $\varphi 1$ mm and not greater than $\varphi 3$ mm, for example. The distance between the nozzle 112 and the surface of the sample W is not shorter than 10 mm and not longer than 20 mm, for example.

The movement mechanism 120 linearly and two-dimensionally moves the stage 10 and the nozzle 112 in a relative manner in a direction parallel to the surface of the stage 10. As indicated by an arrow and a dashed line in FIG. 11B, the nozzle 112 is moved so as to scan the entire surface of the sample W placed on the stage 10. In the case illustrated in FIGS. 11A and 11B, the nozzle 112, not the stage 10, is moved by the movement mechanism 120.

The movement mechanism 120 is not particularly limited, as long as it can two-dimensionally move the nozzle 112 relative to the stage 10. For example, a belt-driven scanning mechanism formed with a combining of a belt, a pulley, and a motor for rotating the pulley is used. Alternatively, a combination of a rack-and-pinion mechanism and a motor is used, for example. Also, a linear motor may be used, for example.

The control unit 122 controls the movement mechanism 120. The control unit 122 controls the scanning range of the nozzle 112 on the stage 10, the velocity of the nozzle 112 relative to the stage 10, and the like to become desired values, for example. The control unit 122 may be hardware such as a circuit board, or may be a combination of hardware and software such as a control program stored in a memory.

The housing 114 houses the stage 10, the nozzle 112, the movement mechanism 120, and the like. The housing 114 protects the stage 10, the nozzle 112, the movement mechanism 120, and the like, and prevents the processing on the sample W from being affected by the external environment.

The inlet 116 is provided at an upper portion of the housing 114, for example, and the outlets 118 are provided at lower portions of the housing 114, for example.

Gaseous matter such as the air or a nitrogen gas is supplied into the housing 114 through the inlet 116, and is discharged through the outlets 118. A pump (not shown) is connected to the outlets 118, for example, and exhausts the gaseous matter in the housing 114. The gaseous matter flows downward in the housing 114. Accordingly, a so-called downflow can be formed in the housing 114.

Next, an example of a method of manufacturing a semiconductor device using the semiconductor manufacturing apparatus of this embodiment is described. An example case where the semiconductor device to be manufactured is a vertical power MOSFET (Metal Oxide Semiconductor Field Effect Transistor) that has metal electrodes on both surfaces of the semiconductor device and includes silicon (Si) is described below.

FIGS. 12A, 12B, 12C, 12D, 12E, 12F, and 12G are schematic cross-sectional diagrams showing the procedures in a device manufacturing method according to this embodiment.

First, a pattern formed with the base regions, the source regions, the gate insulating films, the gate electrodes, the source electrodes, and the like of vertical MOSFETs (semiconductor devices) is formed on the front surface side of a silicon substrate (a semiconductor substrate) 130 having a first surface (hereinafter referred to the front surface) and a second surface (hereinafter also referred to as the back surface). A protection film is then formed on the uppermost layer. The protection film is an inorganic insulating film such as a resin film made of polyimide or the like, a silicon nitride film, or a silicon oxide film. The silicon substrate 130 is preferably exposed through the surface of a dicing region formed on the front surface side.

A supporting substrate 132 is then bonded to the front surface side of the silicon substrate 130 (FIG. 12A). The supporting substrate 132 is quartz glass, for example.

The back surface side of the silicon substrate 130 is ground, so that the silicon substrate 130 becomes thinner. A metal film 134 is then formed on the back surface side of the silicon substrate 130 (FIG. 12B).

The metal film 134 is the drain electrode of the MOSFET. The metal film 134 is formed with stacked films of different kinds of metals, for example. The metal film 134 is formed with stacked films of aluminum, titanium, nickel, and gold in this order from the back surface side of the silicon substrate 130, for example. The metal film 134 is formed by a sputtering technique, for example.

A resin sheet 136 is then bonded to the back surface side of the silicon substrate 130. The resin sheet 136 is a so-called dicing sheet. The resin sheet 136 is secured by a metal frame 138, for example. The resin sheet 136 is attached to the front surface of the metal film 134. The supporting substrate 132 is then removed from the silicon substrate 130 (FIG. 12C).

Grooves 140 are then formed in the silicon substrate 130 so that the metal film 134 on the back surface side is exposed through the front surface side along the dicing region formed on the front surface side of the silicon substrate 130 (FIG. 12D). Here, the dicing region is a reserved region having a predetermined width for dividing semiconductor chips by dicing, and is provided on the front surface side of the silicon substrate 130. The patterns of the semiconductor devices are not formed in the dicing region. The dicing region is provided on the front surface side of the silicon substrate 130, and is formed in a grid-like shape, for example.

The trenches 140 are formed by plasma etching, for example. The plasma etching is a so-called Bosch process in which an isotropic etching step using F-based radicals, a protection film forming step using $CF_4$-based radicals, and an anisotropic etching step using F-based ions are repeated, for example.

The trenches 140 are preferably formed by overall etching, with the mask being the protection film on the front surface side of the silicon substrate 130. This method does not involve lithography. Accordingly, the manufacturing process can be simplified, and the costs can be lowered.

A resin sheet 142 is then bonded to the front surface side of the silicon substrate 130. The resin sheet 142 is a so-called dicing sheet. The resin sheet 142 is secured by a metal frame 144, for example. The resin sheet 142 is attached to the surfaces of the protection film and the metal electrodes on the front surface side. The resin sheet 136 on the back surface side is then removed (FIG. 12E).

With the semiconductor manufacturing apparatus shown in FIGS. 11A and 11B, carbon dioxide particles are then injected onto the metal film 134 from the back surface side of the silicon substrate 130 (FIG. 12F). First, the frame 144 is placed on the stage 10 so that the resin sheet 142 is located on the surface of the stage 10 (FIGS. 11A and 11B). While the nozzle 112 is linearly and two-dimensionally moved in a direction parallel to the surface of the stage 10 by the movement mechanism 120, carbon dioxide particles are injected from the nozzle 112. The nozzle 112 is moved by the movement mechanism 120 so that the carbon dioxide particles are injected onto the entire surface of the sample W.

At this point, gaseous matter such as the air or a nitrogen gas is supplied into the housing 114 through the inlet 116, and is discharged through the outlets 118. Accordingly, a downflow is formed in the housing 114.

As the carbon dioxide particles are injected, the metal film 134 on the back surface side of the trenches 140 is removed. By virtue of the carbon dioxide particles, the metal film 134 is scraped off into the trenches 140, which are hollow portions in physical terms (FIG. 12G).

The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The carbon dioxide particles are ejected together with a nitrogen gas from the nozzle, and are injected onto the metal film 134. The mean particle size of the carbon dioxide particles is preferably not smaller than 10 µm and not greater than 200 µm. The spot diameter on the surface of the metal film 134 when the carbon dioxide particles are injected onto the metal film 134 is preferably not smaller than φ3 mm and not greater than φ10 mm, for example.

When the carbon dioxide particles are injected to remove the metal film 134, the region of the resin sheet 142 is preferably covered with a mask 146, as shown in FIG. 12F. As the region of the resin sheet 142 is covered with the mask 146, the resin sheet 142 can be prevented from coming off the frame 144 due to the impact caused by the carbon dioxide particles, for example. The mask 146 is made of a metal, for example.

After that, the resin sheet 142 on the front surface side of the silicon substrate 130 is removed. As a result, divided MOSFETs are obtained.

Next, the functions and the effects of the processing apparatus of this embodiment are described.

In a case where the metal film 134 is also formed on the back surface side of the silicon substrate 130 as in a vertical MOSFET, the metal film 134 on the back surface side in the dicing region also needs to be removed at the time of dicing. In a case where the semiconductor substrate 130 and the metal film 134 are simultaneously removed from the front surface side by blade dicing, for example, the portions of the metal film 134 at the edges of the trenches 140 in the dicing region curl toward the back surface side, and so-called burrs are formed.

If burrs are formed in the metal film 134, there is a possibility that the semiconductor chips will fail the external appearance test, and will not be turned into products, for example. Also, when the semiconductor chips and beds are joined with joining members such as solders, there is a possibility that soldering defects will be formed due to degraded adhesive properties at portions with burrs.

In the dicing using the semiconductor manufacturing apparatus of this embodiment, after the trenches 140 are formed along the dicing region of the silicon substrate 130, carbon dioxide particles are injected onto the metal film 134 from the back surface side, so that the portions of the metal film 134 located over the trenches 140 are removed. As the removed portions of the metal film 134 are scraped off into the trenches 140 in the form of hollows, formation of burrs can be restrained. Only the portions of the metal film 134 at the portions corresponding to the trenches 140 can be removed in a self-aligning manner.

It is considered that the portions of the metal film 134 located over the trenches 140 are removed mainly by physical impact caused by carbon dioxide particles. In addition to that, it is considered that, as the metal film 134 is rapidly cooled by the low-temperature carbon dioxide particles, and the force generated by gasification and expansion of the carbon dioxide particles that have collided with the metal film 134 is applied, the effect to remove the metal film 134 by physical impact is increased.

Furthermore, in the semiconductor manufacturing apparatus of this embodiment, the surface of the stage 10 tilts with respect to a plane perpendicular to the direction of gravitational force. As the inlet 116 and the outlets 118 are provided, a controlled airflow is formed in the housing 114. With this structure, the metal film 134 removed by carbon dioxide particles is discharged through the outlets 118 by virtue of the airflow in the housing 114. Accordingly, the removed metal film 134 can be prevented from re-adhering to the sample W, or entering the trenches for dicing and turning into residues in the trenches.

So as to prevent the removed metal film 134 from re-adhering to the sample W, the nozzle 112 preferably tilts in the direction of gravitational force, rather than in the direction of a horizontal plane, as shown in FIG. 11A.

In a case where a semiconductor device including a resin film in place of the metal film on the back surface side of the silicon substrate 130 is manufactured, the semiconductor manufacturing apparatus of this embodiment can be used. In this case, carbon dioxide particles are injected, so that the resin film, instead of the metal film, is removed.

As described above, with the processing apparatus of this embodiment, shape abnormalities in the metal film or the resin film at the time of dicing can be restrained. The removed metal film or resin film can also be prevented from re-adhering to the sample, or turning into residues in the trenchs.

(Eleventh Embodiment)

A processing apparatus of this embodiment is the same as the processing apparatus of the tenth embodiment, except that a first tilt mechanism that changes the angle of tilt of the surface of the stage with respect to a plane perpendicular to the direction of gravitational force is provided in the processing apparatus, and the movement mechanism moves the stage, instead of the nozzle. Therefore, the same explanations as those in the tenth embodiment will not be repeated.

Figure 13:
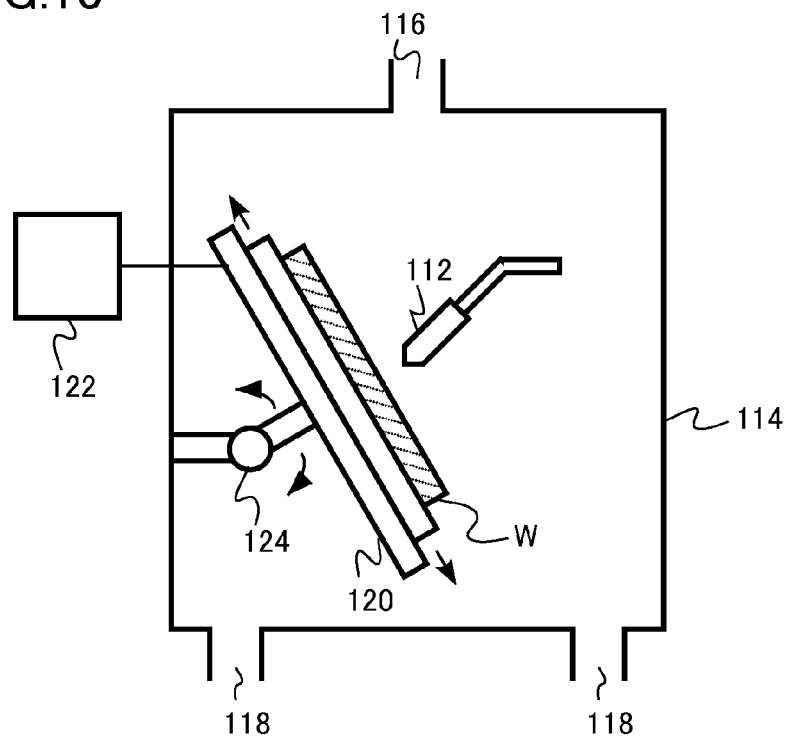
FIG. 13 is a schematic view of a processing apparatus according to an eleventh embodiment.

FIG. 13 is a schematic view of the processing apparatus of this embodiment. FIG. 13 is a schematic view including a cross-section of the apparatus.

The semiconductor manufacturing apparatus of this embodiment includes a first tilt mechanism 124. The first tilt mechanism 124 changes the angle of tilt of the surface of the stage 10 with respect to a plane perpendicular to the direction of gravitational force. The angle of tilt of the first tilt mechanism 124 is controlled by the control unit 122, for example.

The first tilt mechanism 124 is a rotational tilt mechanism formed with a combination of a rotary shaft and a stepping motor, for example. The angle of tilt of the stage 10 can be set so that the removed metal film or resin film can be efficiently transported by the airflow formed by the inlet 116 and the outlets 118 in the housing 114.

In this embodiment, the movement mechanism 120 two-dimensionally moves the stage 10, instead of the nozzle 112. The nozzle 112 is secured.

According to this embodiment, the same effects as those of the tenth embodiment are achieved. In addition to that, the angle of tilt of the stage 10 can be set at a desired value, so as to prevent the removed metal film or resin film from re-adhering to the sample or turning into residues in the trenches. Accordingly, an optimum processing condition for the sample W can be set.

(Twelfth Embodiment)

A processing apparatus of this embodiment is the same as the processing apparatus of the tenth embodiment, except for including a cooling mechanism that cools the atmosphere in the housing. Therefore, the same explanations as those in the tenth embodiment will not be repeated.

Figure 14:
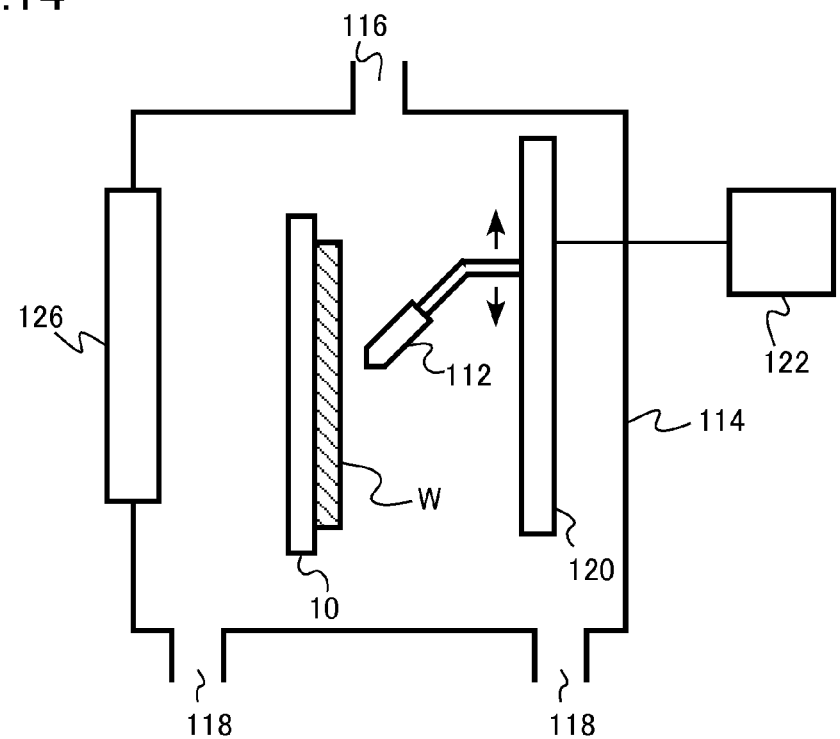
FIG. 14 is a schematic view of a processing apparatus according to a twelfth embodiment.

FIG. 14 is a schematic view of the processing apparatus of this embodiment. FIG. 14 is a schematic view including a cross-section of the apparatus.

The semiconductor manufacturing apparatus of this embodiment includes a cooling mechanism 126 that cools the atmosphere in the housing 114. As the cooling mechanism 126, a heat pump is used, for example.

According to this embodiment, the temperature in the housing 114 is lowered to prevent gasification of the carbon dioxide particles injected from the nozzle. Accordingly, the efficiency of the removal of the metal film or the resin film is increased. Also, as the temperature in the housing 114 is maintained at a predetermined temperature not higher than room temperature, the sample W can be processed with excellent reproducibility.

(Thirteenth Embodiment)

A processing apparatus of this embodiment is the same as the processing apparatus of the tenth embodiment, except for including a second tilt mechanism that changes the angle of tilt of the nozzle with respect to the surface of the stage. Therefore, the same explanations as those in the tenth embodiment will not be repeated.

Figure 15:
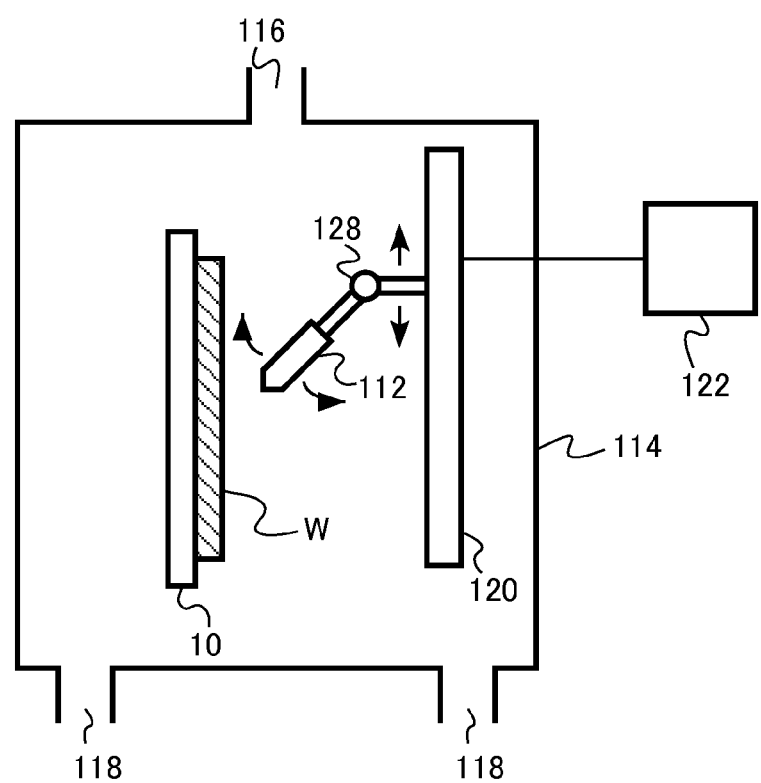
FIG. 15 is a schematic view of a processing apparatus according to a thirteenth embodiment.

FIG. 15 is a schematic view of the processing apparatus of this embodiment. FIG. 15 is a schematic view including a cross-section of the apparatus.

The semiconductor manufacturing apparatus of this embodiment includes a second tilt mechanism 128. The second tilt mechanism 128 changes the angle of tilt of the nozzle 112 with respect to the surface of the stage 10. The angle of tilt of the second tilt mechanism 128 is controlled by the control unit 122, for example.

The second tilt mechanism 128 is a rotational tilt mechanism formed with a combination of a rotary shaft and a stepping motor, for example. The angle of tilt of the nozzle 112 can be set as an optimum condition for removing the metal film or the resin film of the sample W.

By a manufacturing method using the semiconductor manufacturing apparatus of this embodiment, carbon dioxide particles are injected onto the sample W, while the angle of tilt of the nozzle 112 with respect to the surface of the stage 10 is maintained at a smaller angle than 90 degrees, such as an angle not smaller than 15 degrees and not larger than 45 degrees.

According to this embodiment, the same effects as those of the tenth embodiment are achieved. In addition to that, the angle of tilt of the nozzle 112 can be set at a desired value, so as to prevent the removed metal film or resin film from re-adhering to the sample or turning into residues in the trenchs. Accordingly, an optimum processing condition for the sample W can be set.

Alternatively, the angle of tilt of the nozzle 112 with respect to the surface of the stage 10 may be fixed at a smaller angle than 90 degrees. With this structure, the metal film or the resin film removed by the carbon dioxide particles can also be prevented from re-adhering to the sample W, or entering the trenches for dicing and turning into residues in the trenchs.

(Fourteenth Embodiment)

A processing apparatus of this embodiment is the same as the processing apparatus of the tenth embodiment, except that a rotation mechanism that rotates the stage is included in the processing apparatus, and the nozzle is one-dimensionally moved by the movement mechanism. Therefore, the same explanations as those in the tenth embodiment will not be repeated.

Figure 16A:
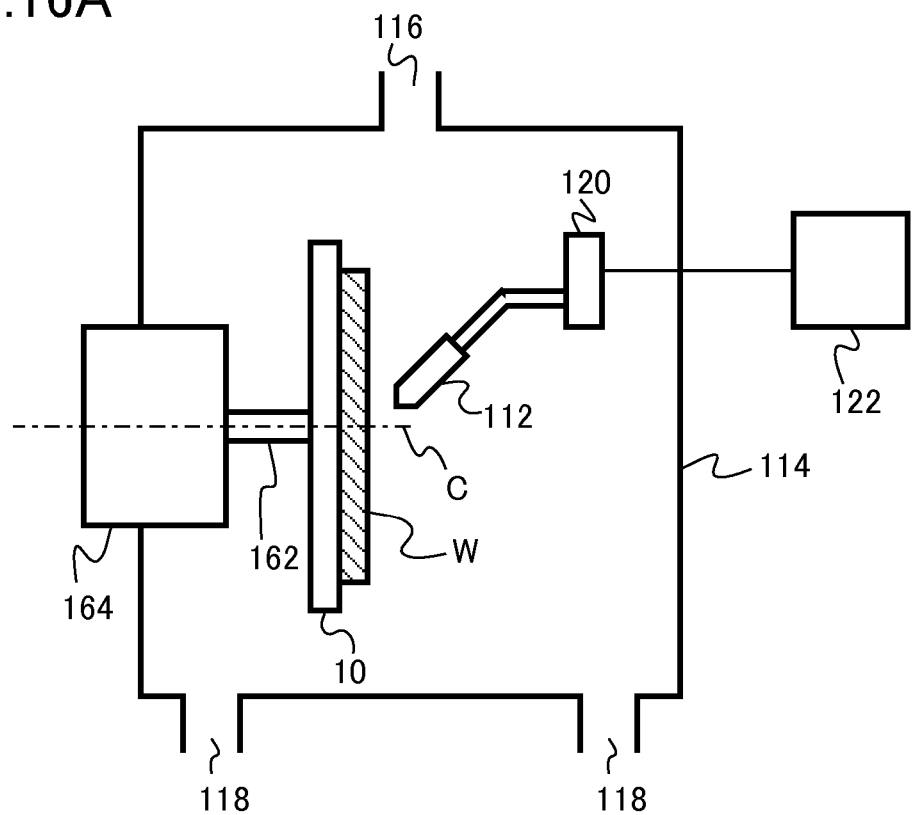
FIGS. 16A and 16B are schematic views of a processing apparatus according to a fourteenth embodiment.
Figure 16B:
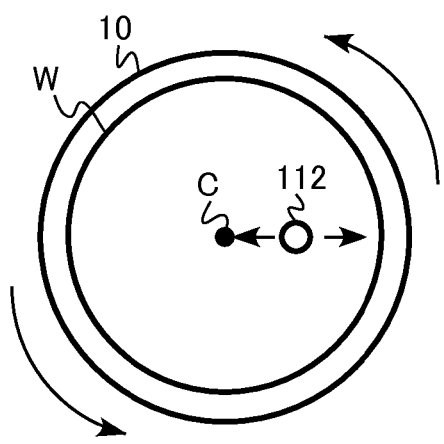

FIGS. 16A and 16B are schematic views of the processing apparatus of this embodiment. FIG. 16A is a schematic diagram including a cross-section of the apparatus. FIG. 16B is a top view of the stage.

The semiconductor manufacturing apparatus of this embodiment further includes a support shaft 162 and a rotation mechanism 164.

The stage 10 is secured to the support shaft 162. The rotation mechanism 164 rotates the stage 10. The rotation mechanism 164 includes a motor and a bearing that rotatably holds the support shaft 162, for example. The stage 10 is rotated about a rotation axis C by the rotation mechanism 164.

As indicated by arrows in FIGS. 16A and 16B, the movement mechanism 120 linearly moves the stage 10 and the nozzle 112 in a relative manner in a direction perpendicular to the rotation axis C of the stage 10. For example, the nozzle 112 is moved so as to scan between the rotation axis C of the stage 10 and the edge of the sample W. In the case illustrated in FIGS. 16A and 16B, the nozzle 112, not the stage 10, is moved by the movement mechanism 120.

The movement mechanism 120 is not particularly limited, as long as it can linearly scan the nozzle 112 relative to the stage 10. For example, a belt-driven movement mechanism formed with a combining of a belt, a pulley, and a motor for rotating the pulley is used. Alternatively, a combination of a rack-and-pinion mechanism and a motor is used, for example. Also, a linear motor may be used, for example.

By a semiconductor device manufacturing method of this embodiment, the semiconductor manufacturing apparatus shown in FIGS. 16A and 16B is used, and carbon dioxide particles are injected onto the metal film 134 from the back surface side of the silicon substrate 130. At this point, the frame 144 is placed on the stage 10 so that the resin sheet 142 is located on the surface of the stage 10 (FIGS. 16A and 16B). The stage 10 is then rotated by the rotation mechanism 164. As shown in FIG. 16B, while the nozzle 112 is linearly reciprocated in a direction perpendicular to the rotation axis of the stage 10 by the movement mechanism 120, carbon dioxide particles are injected from the nozzle 112.

In the semiconductor manufacturing apparatus of this embodiment, carbon dioxide particles are injected onto a sample placed on the rotating stage 10. Accordingly, carbon dioxide particles can be injected more evenly onto the surface of the sample than in a case where carbon dioxide particles are injected onto a sample placed on a fixed stage. Thus, the same effects as those of the first embodiment are achieved, and in addition to that, the metal film 134 can be evenly removed.

Also, as carbon dioxide particles are injected onto a rotating sample, the velocity of the sample is added to the impact velocity of the carbon dioxide particles. Accordingly, the velocity at which the carbon dioxide particles collide with the metal film 134 becomes higher. Thus, the metal film 134 can be removed with high efficiency.

(Fifteenth Embodiment)

A processing apparatus of this embodiment is the same as the processing apparatus of the tenth embodiment, except for including more than one nozzle. Therefore, the same explanations as those in the tenth embodiment will not be repeated.

Figure 17:
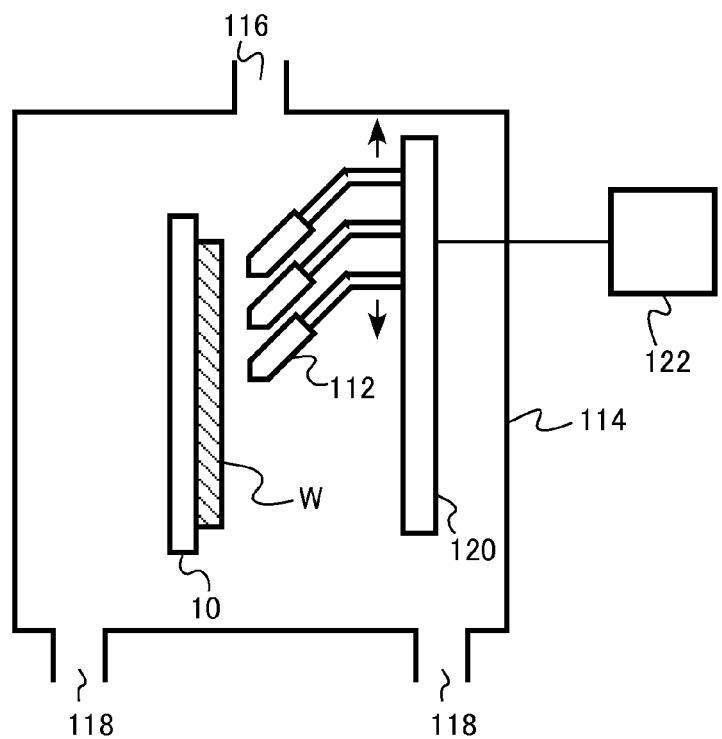
FIG. 17 is a schematic view of a processing apparatus according to a fifteenth embodiment.

FIG. 17 is a schematic view of the processing apparatus of this embodiment. FIG. 17 is a schematic view including a cross-section of the apparatus.

As shown in FIG. 17, the semiconductor manufacturing apparatus of this embodiment includes three nozzles 112. The number of nozzles 112 is not limited to three, as long as it is two or larger.

According to this embodiment, the productivity of processing can be increased by virtue of the nozzles 112.

(Sixteenth Embodiment)

A processing apparatus of this embodiment is the same as the processing apparatus of the tenth embodiment, except for including a movement mechanism that moves the stage and the nozzle in a relative manner in a direction perpendicular to the surface of the stage. Therefore, the same explanations as those in the tenth embodiment will not be repeated.

Figure 18:
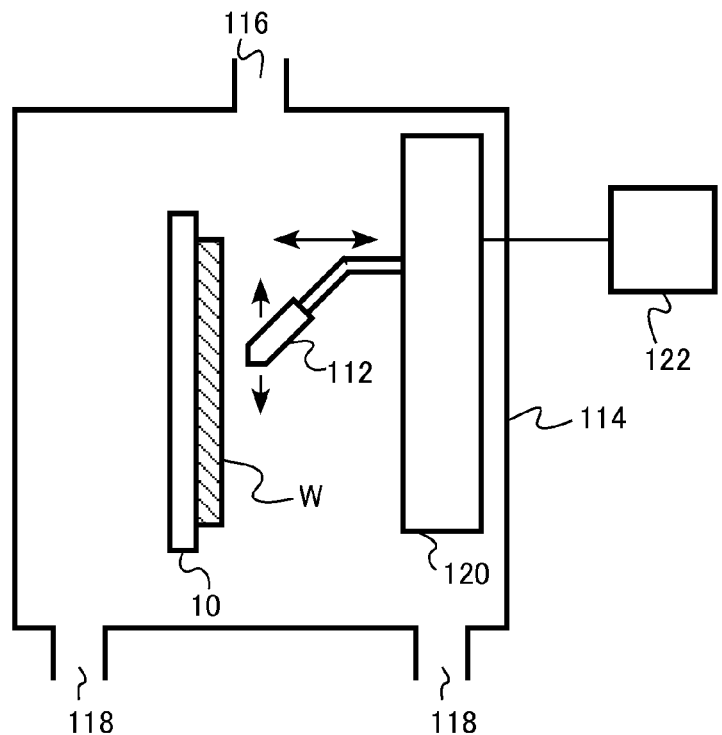
FIG. 18 is a schematic view of a processing apparatus according to a sixteenth embodiment.

FIG. 18 is a schematic view of the processing apparatus of this embodiment. FIG. 18 is a schematic view including a cross-section of the apparatus.

As shown in FIG. 18, the semiconductor manufacturing apparatus of this embodiment includes a movement mechanism 120 that moves the stage 10 and the nozzle 112 in a relative manner in a direction perpendicular to the surface of the stage 10. Here, the movement mechanism 120 also has the function of moving the stage 10 and the nozzle 112 in a relative manner in a direction parallel to the surface of the stage 10. A movement mechanism that moves the stage 10 and the nozzle 112 in a relative manner in a direction perpendicular to the surface of the stage 10 may be employed as a movement mechanism independent of the movement mechanism that moves the stage 10 and the nozzle 112 in a direction parallel to the surface of the stage 10.

According to this embodiment, the distance between the stage 10 and the nozzle 112 can be set at a desired value, and accordingly, an optimum processing condition for the sample W can be set.

(Seventeenth Embodiment)

A processing apparatus of this embodiment is the same as the processing apparatus of the tenth embodiment, except that the surface of the stage has a recess. Therefore, the same explanations as those in the tenth embodiment will not be repeated.

Figure 19:
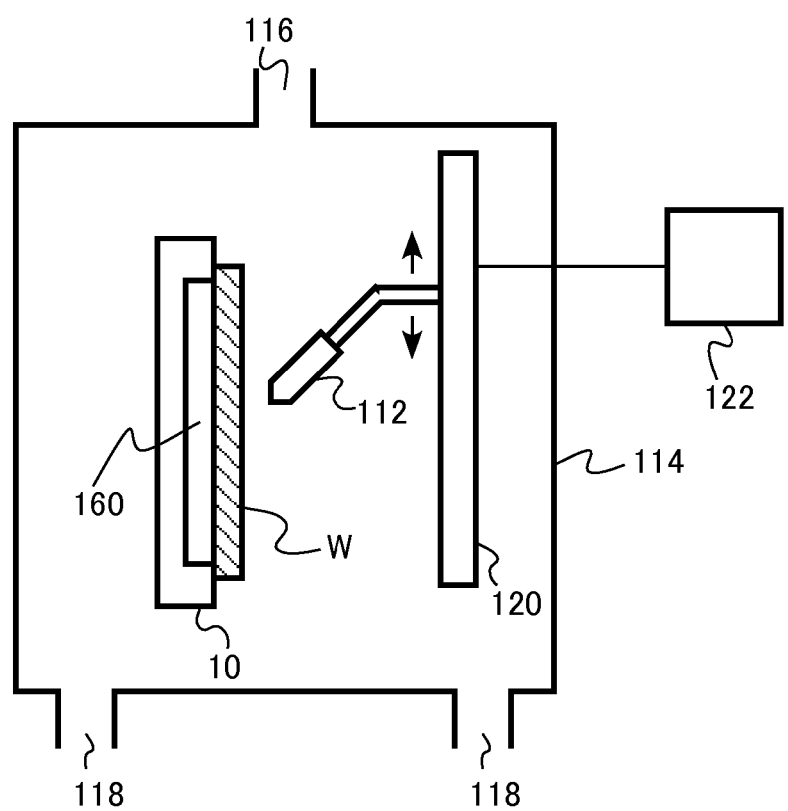
FIG. 19 is a schematic view of a processing apparatus according to a seventeenth embodiment.

FIG. 19 is a schematic view of the processing apparatus of this embodiment. FIG. 19 is a schematic view including a cross-section of the apparatus.

As shown in FIG. 19, in the semiconductor manufacturing apparatus of this embodiment, the surface of the stage 10 has a recess. Accordingly, when a sample W is placed on the stage 10, a space 160 is formed between the stage 10 and the sample W.

According to this embodiment, the space 160 is formed between the stage 10 and the sample W. Therefore, when dicing is performed on the silicon substrate 130, for example, MOSFETs divided by the dicing can be received by the recess of the stage. Accordingly, the step of bonding a dicing sheet to the front surface side and the back surface side can be skipped. Thus, the productivity of the processing can be increased.

In the tenth through seventeenth embodiments described above, the semiconductor devices are vertical MOSFETs. However, the semiconductor devices are not limited to vertical MOSFETs.

In the tenth through seventeenth embodiments, the metal film or the resin film is removed at the time of dicing. However, the processing apparatus of each of the embodiments can also be used in washing the surface of the semiconductor substrate, for example.

In the tenth through seventeenth embodiments, the substance to be injected is particles containing carbon dioxide. However, the substance to be injected may be some other substance, such as pressurized water, pressurized water containing abrasive grains, or particles other than carbon dioxide particles. It is also possible to use some other particles that are solid at the time of injecting from the nozzle but are gasified in an atmosphere in which a substrate is placed at ordinary temperature or the like. For example, nitrogen particles or argon particles can also be used.

Although semiconductor manufacturing apparatuses have been described as examples in the tenth through seventeenth embodiments, these embodiments can also be applied to a MEMS (Micro Electro Mechanical Systems) manufacturing apparatus.

In each of the example cases described in the tenth through seventeenth embodiments, the nozzle injects a substance to part of a sample, and the stage and the nozzle are moved in a relative manner so that the entire sample is processed. However, the nozzle can be designed to inject a substance to the entire surface of the sample so that the entire sample can be processed at once, for example. The nozzle capable of processing an entire sample at once can be produced by adjusting the nozzle diameter to the size of the sample or combining a large number of nozzles, for example.

(Eighteenth Embodiment)

A dicing apparatus of this embodiment includes: a dicing unit that forms a trench in a sample; and a processing unit having a nozzle that removes at least part of the sample by injecting particles onto the sample having the trench formed therein.

The dicing apparatus of this embodiment is a dicing apparatus to be used in dicing a semiconductor substrate.

In this embodiment, an example case where the particles to be injected onto the sample is particles containing carbon dioxide is described. The particles containing carbon dioxide (hereinafter also referred to simply as carbon dioxide particles) are particles containing carbon dioxide as a principal component. In addition to carbon dioxide, the particles may contain inevitable impurities, for example.

Figure 20:
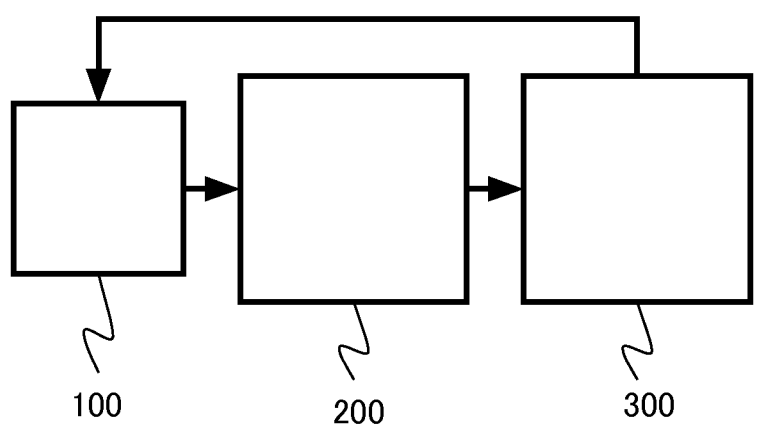
FIG. 20 is a block diagram of a dicing apparatus according to an eighteenth embodiment.

FIG. 20 is a block diagram of the dicing apparatus of this embodiment. The dicing apparatus of this embodiment includes a cassette table 100, a dicing unit 200, and a processing unit 300.

In the dicing apparatus of this embodiment, a conveyance mechanism (not shown) is provided. The conveyance mechanism enables movement of a sample (a workpiece) among the cassette table 100, the dicing unit 200, and the processing unit 300. The conveyance mechanism includes a conveyance arm that holds a sample by suction, and a conveyance robot that moves the conveyance arm.

A cassette holding a sample is placed on the cassette table 100. Devices partitioned by a dicing region (predetermined division lines), for example, are formed in the sample.

The sample to be processed by the dicing apparatus of this embodiment is not particularly limited. For example, the sample may be a semiconductor wafer such as silicon, a gallium nitride semiconductor, or silicon carbide, a package for a semiconductor product, or an inorganic material substrate such as ceramic or glass. A metal film or a resin film may be formed on one or both of the surfaces of the sample.

A sample is bonded onto a dicing sheet bonded to a ring-like dicing frame, for example. In this manner, the sample is secured to the dicing frame. The dicing sheet is a resin film. The cassette to be placed on the cassette table 100 holds samples each secured to a dicing frame, for example.

Figure 21:
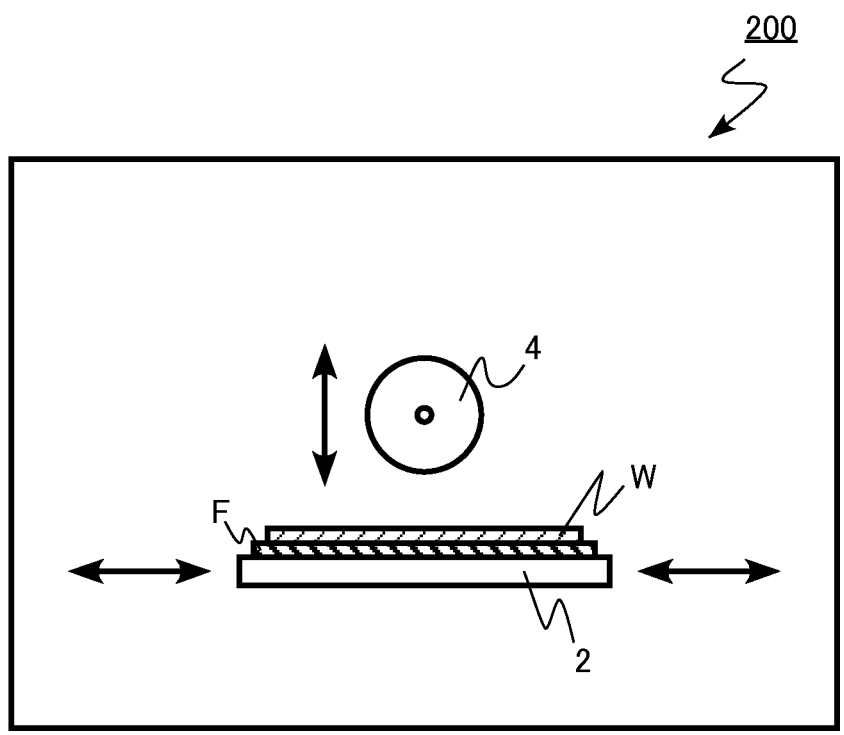
FIG. 21 is a schematic view of a dicing unit according to the eighteenth embodiment.

FIG. 21 is a schematic view of the dicing unit of this embodiment. The dicing unit 200 has the function of forming trenches in the dicing region of a sample W.

The dicing unit 200 includes an XY table 2 and a rotary blade 4. The sample W is placed on the XY table 2. The XY table 2 moves in a two-dimensional plane. The rotary blade 4 rotates about a rotary shaft, and forms trenches in a sample or cuts a sample by forming trenches. The rotary blade 4 can move up and down relative to the XY table 2.

Figure 22A:
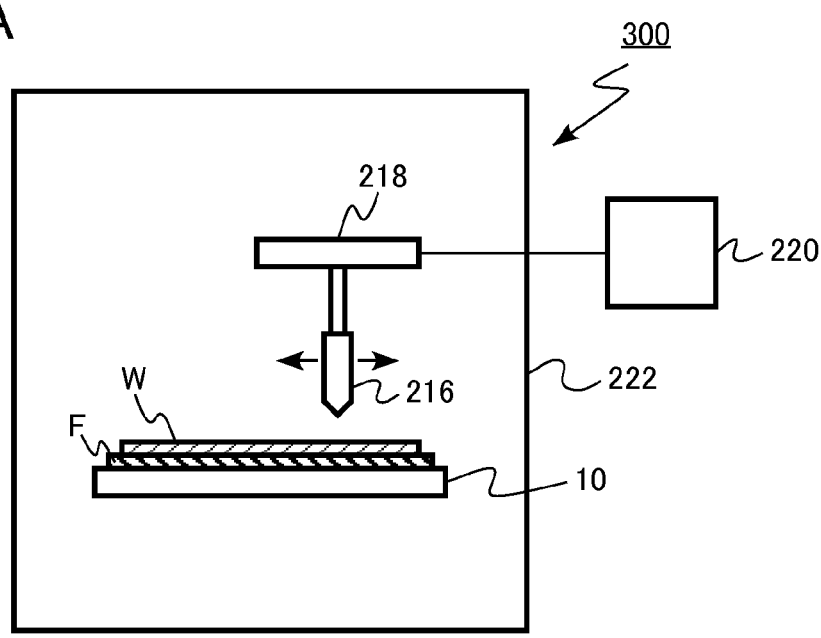
FIGS. 22A and 22B are schematic views of the processing unit according to the eighteenth embodiment.
Figure 22B:
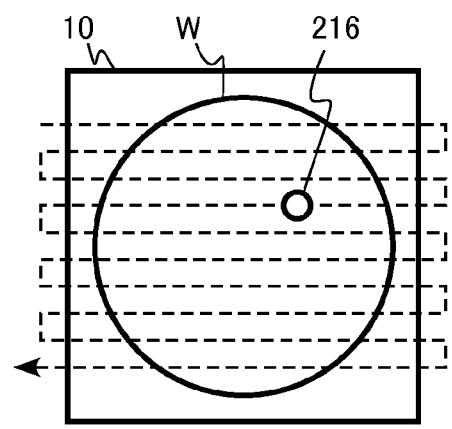

FIGS. 22A and 22B are schematic views of the processing unit of this embodiment. FIG. 22A is a schematic diagram including a cross-section of the processing unit. FIG. 22B is a top view of the stage.

The processing unit 300 of this embodiment includes a stage 10, a nozzle 216, a movement mechanism 218, a control unit 220, and a processing chamber 222.

The stage 10 is designed so that the sample W to be process can be placed thereon. The sample W secured to a dicing frame F, for example, is placed on the stage 10.

The nozzle 216 injects particles onto the sample W having trenches formed therein, and removes at least part of the sample W. The nozzle 216 removes the portions corresponding to the trenchs from the sample W. Carbon dioxide particles are injected from the nozzle 216. The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The particles are not limited to carbon dioxide particles. The particles are preferably particles of a material that sublimes under ordinary pressure like carbon dioxide particles.

The nozzle 216 is connected to a liquefied carbon dioxide tank (not shown), for example. Carbon dioxide particles are generated by adiabatically expanding and solidifying the liquefied carbon dioxide in the tank. The nozzle 216 is connected to a nitrogen gas supply source (not shown), for example. The generated carbon dioxide particles, together with a nitrogen gas, for example, are injected from the nozzle 216 toward the sample W placed on the stage 10.

The diameter of the nozzle 216 is not smaller than φ1 mm and not greater than φ3 mm, for example. The distance between the nozzle 216 and the surface of the sample W is not shorter than 10 mm and not longer than 20 mm, for example.

The movement mechanism 218 linearly and two-dimensionally moves the stage 10 and the nozzle 216 in a relative manner in a direction parallel to the surface of the stage 10. As indicated by an arrow and a dashed line in FIG. 22B, the nozzle 216 is moved so as to scan the entire surface of the sample W placed on the stage 10. In the case illustrated in FIGS. 22A and 22B, the nozzle 216, not the stage 10, is moved by the movement mechanism 218.

The movement mechanism 218 is not particularly limited, as long as it can two-dimensionally move the nozzle 216 relative to the stage 10. For example, a belt-driven movement mechanism formed with a combining of a belt, a pulley, and a motor for rotating the pulley is used. Alternatively, a combination of a rack-and-pinion mechanism and a motor is used, for example. Also, a linear motor may be used, for example.

The control unit 220 controls the movement mechanism 218. The control unit 220 controls the scanning range of the nozzle 216 on the stage 10, the velocity of the nozzle 216 relative to the stage 10, and the like to become desired values, for example. The control unit 220 may be hardware such as a circuit board, or may be a combination of hardware and software such as a control program stored in a memory.

A housing 222 houses the stage 10, the nozzle 216, the movement mechanism 218, and the like. The housing 222 protects the stage 10, the nozzle 216, the movement mechanism 218, and the like, and prevents the processing on the sample W from being affected by the external environment.

Next, an example of a dicing method using the dicing apparatus of this embodiment is described. An example case where the sample W to be diced is vertical power MOSFETs (Metal Oxide Semiconductor Field Effect Transistors) that have metal electrodes on both surfaces of the semiconductor devices and include silicon (Si) is described below.

Figure 23A:
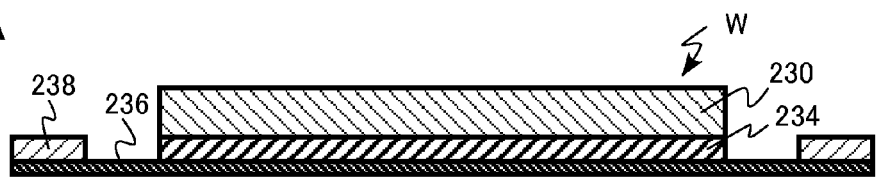
FIGS. 23A, 23B, and 23C are schematic cross-sectional diagrams showing the procedures in a dicing method according to the eighteenth embodiment.
Figure 23B:
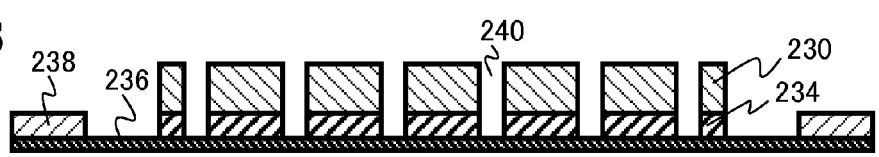
Figure 23C:
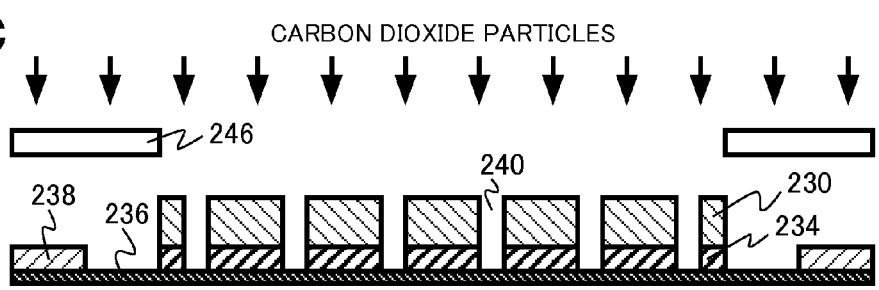

FIGS. 23A, 23B, and 23C are schematic cross-sectional diagrams showing the procedures in a dicing method according to this embodiment.

In the sample W, a pattern formed with the base regions, the source regions, the gate insulating films, the gate electrodes, the source electrodes, and the like of vertical MOSFETs (semiconductor devices) is formed on the front surface side of a silicon substrate (a semiconductor substrate) 230 having a first surface (hereinafter referred to as the front surface) and a second surface (hereinafter also referred to as the back surface). A protection film is formed on the uppermost layer. The protection film is an inorganic insulating film such as a resin film made of polyimide or the like, a silicon nitride film, or a silicon oxide film. The silicon substrate 230 is exposed through the surface of a dicing region formed on the front surface side.

A metal film 234 is formed on the back surface side of the silicon substrate 230 (FIG. 23A). The metal film 234 is the drain electrode of each MOSFET. The metal film 234 is formed with stacked films of different kinds of metals, for example. The metal film 234 is formed with stacked films of aluminum, titanium, nickel, and gold in this order from the back surface side of the silicon substrate 230, for example.

The sample W is secured to a metal dicing frame 238. A resin sheet 236 is bonded to the back surface side of the silicon substrate 230. The resin sheet 236 is a so-called dicing sheet. The resin sheet 236 is secured to the dicing frame 238. The resin sheet 236 is attached to the front surface of the metal film 234.

The sample W secured to the dicing frame 238 is inserted into a cassette. The cassette is placed on the cassette table 100 (FIG. 20).

The sample W is then pulled out of the cassette and is placed onto the XY table 2 of the dicing unit 200 by the conveyance mechanism. The rotary blade 4 is then positioned to the dicing region of the sample W. The rotary blade 4 is then moved down toward the sample W, so that the rotary blade 4 cuts into the sample W.

With the rotary blade 4, trenches 240 are formed along the dicing region of the sample W. The trenches 240 are formed so as to penetrate through the metal film 234 on the back surface.

The dicing region is provided on the front surface side of the silicon substrate 230, and is formed in a grid-like shape, for example. The silicon substrate 230 is cut along the dicing region, and is divided into MOSFETs (FIG. 23B).

The sample W is then moved by the conveyance mechanism, and is placed on the stage 10 of the processing unit 300. Carbon dioxide particles are then injected onto the sample W from the front surface side of the silicon substrate 230 (FIG. 23C).

First, the dicing frame 238 is placed on the stage 10 so that the resin sheet 236 is located on the surface of the stage 10. While the nozzle 216 is linearly and two-dimensionally moved in a direction parallel to the surface of the stage 10 by the movement mechanism 218 as shown in FIG. 22B, carbon dioxide particles are injected from the nozzle 216. The nozzle 216 is moved by the movement mechanism 218 so that the carbon dioxide particles are injected onto the entire surface of the sample W. The nozzle 216 moves over the surface of the sample W, and injects the carbon dioxide particles onto the entire surface of the sample W.

As the carbon dioxide particles are injected, the burrs, which have been formed in the processed surfaces such as the side surfaces and the corners of the trenches 240 at the time of dicing with the rotary blade 4, are removed. At the same time, particles and the like that have adhered to the sample W at the time of dicing with the rotary blade 4 are also removed.

The carbon dioxide particles are ejected together with a nitrogen gas from the nozzle 216, and are injected onto the sample W. The mean particle size of the carbon dioxide particles is preferably not smaller than 10 μm and not greater than 200 μm. The spot diameter on the surface of the sample W when the carbon dioxide particles are injected onto the sample W is preferably not smaller than φ3 mm and not greater than φ10 mm, for example.

When the carbon dioxide particles are injected, the region of the resin sheet 236 is preferably covered with a mask 246, as shown in FIG. 23C. As the region of the resin sheet 236 is covered with the mask 246, the resin sheet 236 can be prevented from coming off the dicing frame 238 due to the impact caused by the carbon dioxide particles, for example. The mask 246 is made of a metal, for example.

The sample W is then moved by the conveyance mechanism, and is housed in the cassette on the cassette table 100. After that, another sample W may be taken out of the cassette, and dicing may be performed on that sample W in the same manner as above, for example.

Next, the functions and the effects of the dicing apparatus of this embodiment are described.

In a case where the metal film 234 is also formed on the back surface side of the silicon substrate 230 as in a vertical MOSFET, the metal film 234 on the back surface side in the dicing region also needs to be removed at the time of dicing. In a case where the semiconductor substrate 230 and the metal film 234 are simultaneously removed from the front surface side by blade dicing with a rotary blade, for example, the portions of the metal film 234 at the edges (corners) of the trenchs 240 in the dicing region curl toward the back surface side, and so-called burrs are formed. Burrs are also formed at the portions of the silicon substrate 230 forming the side surfaces of the trenchs 240, and at the portions of the metal film 234 forming the side surfaces of the trenchs 240.

If burrs are formed in the metal film 234, there is a possibility that the semiconductor chips will fail the external appearance test, and will not be turned into products, for example. Also, when the semiconductor chips and beds are joined with joining members such as solders, there is a possibility that soldering defects will be formed due to degraded adhesive properties at portions with burrs. Therefore, the production yield might decrease.

The burrs formed at the portions of the silicon substrate 230 forming the side surfaces of the trenchs 240 and at the portions of the metal film 234 forming the side surfaces of the trenchs 240 also cause packaging defects among semiconductor chips, and the production yield might decrease.

After forming the trenchs 240 along the dicing region of the sample W, the dicing apparatus of this embodiment injects carbon dioxide particles from the front surface side of the sample W, to remove the burrs formed in the processed surfaces of silicon substrate 230 and the metal film 234.

It is considered that the burrs in the processed surfaces of the trenchs 240 are removed mainly by physical impact caused by carbon dioxide particles. In addition to that, it is considered that, as the silicon substrate 230 and the metal film 234 are rapidly cooled by the low-temperature carbon dioxide particles, and the force generated by gasification and expansion of the carbon dioxide particles that have collided with the silicon substrate 230 and the metal film 234 is applied, the effect to remove the burrs by physical impact is increased.

Furthermore, the dicing apparatus of this embodiment can remove not only the burrs but also the particles and the like that have adhered to the sample W at the time of the formation of the trenchs 240 with the rotary blade 4, for example, by spaying carbon dioxide particles.

In a case where a sample including a resin film in place of the metal film on the back surface side of the silicon substrate 230 is diced, the dicing apparatus of this embodiment can be used in the dicing. Alternatively, a silicon substrate not including any metal film or resin film can be diced with the dicing apparatus of this embodiment. In any case, the burrs formed in the processed surfaces of the trenchs 240 can be removed.

As described above, this embodiment can provide a dicing apparatus that can remove burrs and particles formed at the time of dicing of a sample.

(Nineteenth Embodiment)

A dicing apparatus of this embodiment further includes a resin sheet replacing unit that removes a first resin sheet attached to one of the surfaces of a sample, and attaches a second resin sheet to the other one of the surfaces of the sample. The dicing apparatus of this embodiment is the same as the dicing apparatus of the eighteenth embodiment, except for including the resin sheet replacing unit. Therefore, the same explanations as those in the eighteenth embodiment will not be repeated.

Figure 24:
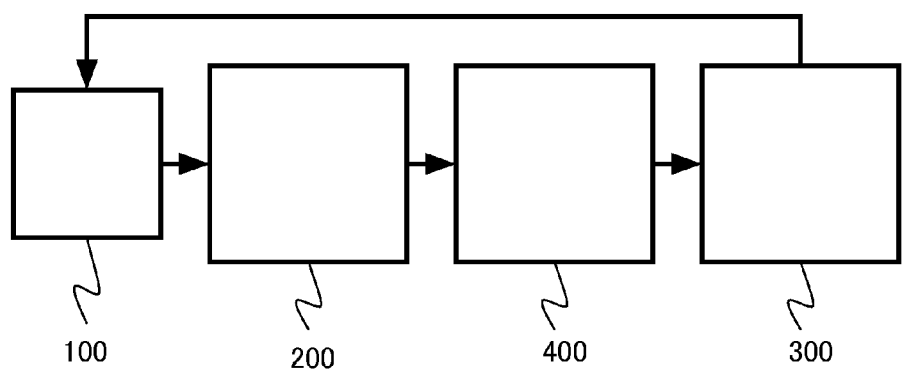
FIG. 24 is a block diagram of a dicing apparatus according to a nineteenth embodiment.

FIG. 24 is a block diagram of the dicing apparatus of this embodiment. The dicing apparatus of this embodiment includes a cassette table 100, a dicing unit 200, a processing unit 300, and a resin sheet replacing unit 400.

Figure 25:
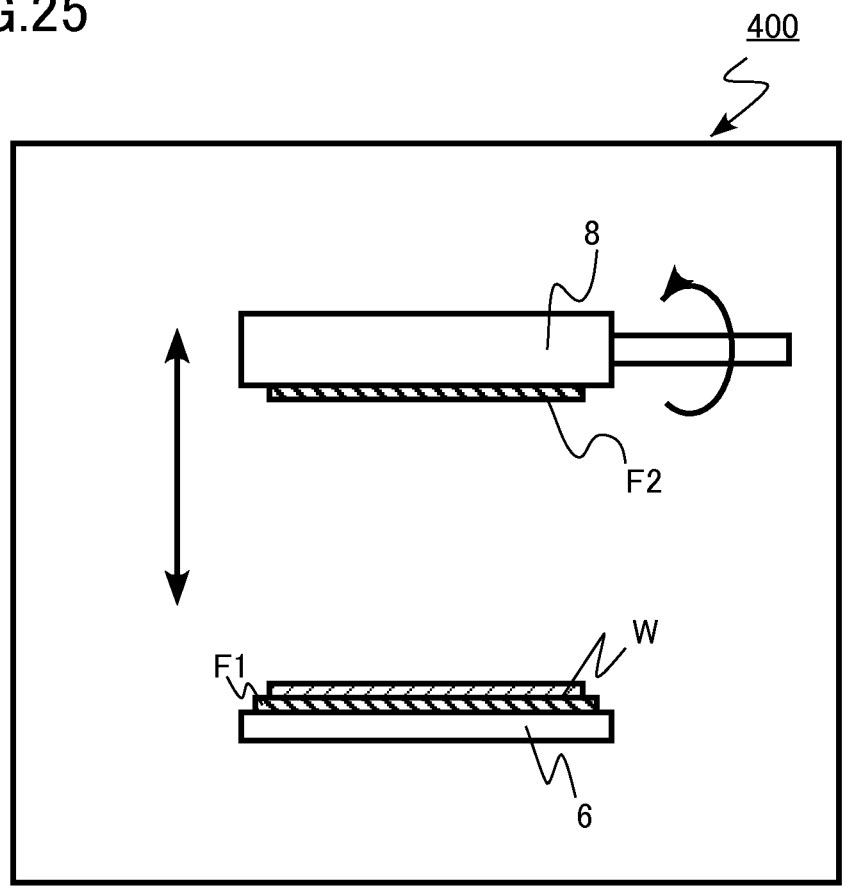
FIG. 25 is a schematic view of a resin sheet replacing unit according to the nineteenth embodiment.

FIG. 25 is a schematic view of the resin sheet replacing unit of this embodiment. The resin sheet replacing unit 400 has the function of removing a first resin sheet attached to one of the surfaces of a sample W, and attaches a second resin sheet to the other one of the surfaces of the sample.

The resin sheet replacing unit 400 includes a first chuck unit 6 and a second chuck unit 8. The first chuck unit 6 holds a first dicing frame F1. The sample W attached to the first resin sheet is secured to the first dicing frame F1.

The second chuck unit 8 holds a second dicing frame F2 to which the second resin sheet as a replacement is attached. The second chuck unit 8 can move up and down, and can also rotatively move.

The second chuck unit 8 holding the second dicing frame F2 is moved downward, for example. As the second resin sheet is brought into tight contact with the sample W, the sample W is attached to the second resin sheet, and is secured to the second dicing frame F2. After that, the sample W and the first resin sheet are removed from each other. In this manner, resin sheets are changed.

Next, an example of a dicing method using the dicing apparatus of this embodiment is described. An example case where the sample W to be diced is vertical power MOSFETs (Metal Oxide Semiconductor Field Effect Transistors) that have metal electrodes on both surfaces of the semiconductor devices and include silicon (Si) is described below.

FIGS. 26A, 26B, 26C, and 26D are schematic cross-sectional diagrams showing the procedures in an example of a dicing method according to this embodiment.

In the sample W, a pattern formed with the base regions, the source regions, the gate insulating films, the gate electrodes, the source electrodes, and the like of vertical MOSFETs (semiconductor devices) is formed on the front surface side of a silicon substrate (a semiconductor substrate) 230 having a first surface (hereinafter referred to the front surface) and a second surface (hereinafter also referred to as the back surface). A protection film is formed on the uppermost layer. The protection film is an inorganic insulating film such as a resin film made of polyimide or the like, a silicon nitride film, or a silicon oxide film. The silicon substrate 230 is exposed through the surface of a dicing region formed on the front surface side.

Figure 26A:
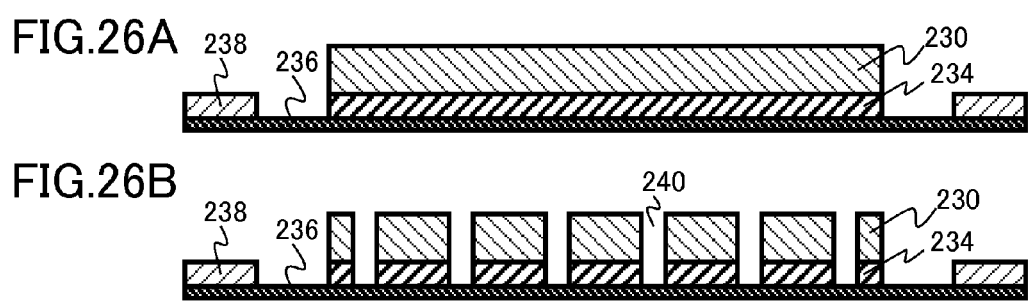

A metal film 234 is formed on the back surface side of the silicon substrate 230 (FIG. 26A). The metal film 234 is the drain electrode of each MOSFET. The metal film 234 is formed with stacked films of different kinds of metals, for example. The metal film 234 is formed with stacked films of aluminum, titanium, nickel, and gold in this order from the back surface side of the silicon substrate 230, for example.

The sample W is secured to a metal dicing frame (the first dicing frame) 238. A resin sheet (the first resin sheet) 236 is bonded to the back surface side of the silicon substrate 230. The resin sheet 236 is a so-called dicing sheet. The resin sheet 236 is secured to the dicing frame 238. The resin sheet 236 is attached to the front surface of the metal film 234.

The sample W secured to the dicing frame 238 is inserted into a cassette. The cassette is placed on the cassette table 100 (FIG. 24).

The sample W is then pulled out of the cassette and is placed onto the XY table 2 of the dicing unit 200 by the conveyance mechanism. The rotary blade 4 is then positioned to the dicing region of the sample W. The rotary blade 4 is then moved down toward the sample W, so that the rotary blade 4 cuts into the sample W.

With the rotary blade 4, trenchs 240 are formed along the dicing region of the sample W. The trenches 240 are formed so as to penetrate through the metal film 234 on the back surface.

The dicing region is provided on the front surface side of the silicon substrate 230, and is formed in a grid-like shape, for example. The silicon substrate 230 is cut along the dicing region, and is divided into MOSFETs (FIG. 26B).

The sample W is then moved by the conveyance mechanism, and is held on the first chuck unit 6 of the resin sheet replacing unit 400. The second chuck unit 8 is then lowered, and a resin sheet (the second resin sheet) 242 is attached to the front surface (the other one of the surfaces) side of the sample W. The resin sheet 242 is attached to the surfaces of the protection film and the metal electrodes on the front surface side. The resin sheet 242 is secured to a dicing frame (the second dicing frame) 244.

Figure 26C:
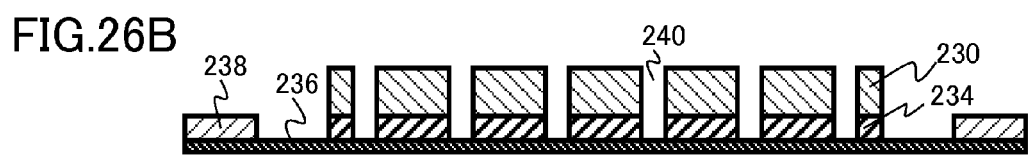

The resin sheet (first resin sheet) 236 attached to the back surface (the one of the surfaces) side of the sample W is then removed. The sample W is secured to the dicing frame (second dicing frame) 244 (FIG. 26C).

The sample W is then moved by the conveyance mechanism, and is placed on the stage 10 of the processing unit 300. Carbon dioxide particles are then injected onto the sample W from the back surface side of the silicon substrate 230 or from the side of the metal film 234 (FIG. 26D).

First, the dicing frame 238 is placed on the stage 10 so that the resin sheet 242 is located on the surface of the stage 10. While the nozzle 216 is linearly and two-dimensionally moved in a direction parallel to the surface of the stage 10 by the movement mechanism 218 as shown in FIG. 22B, carbon dioxide particles are injected from the nozzle 216. The nozzle 216 is moved by the movement mechanism 218 so that the carbon dioxide particles are injected onto the entire surface of the sample W.

Figure 26D:
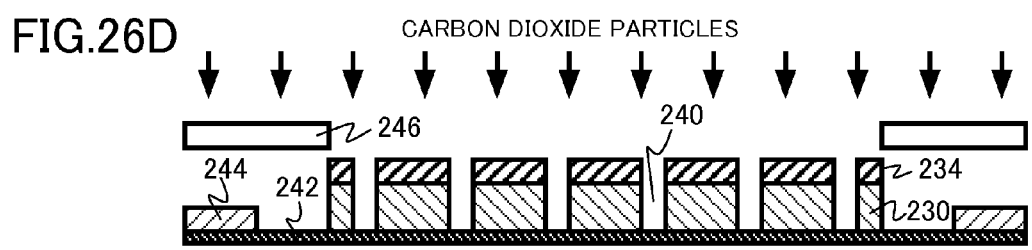

When the carbon dioxide particles are injected, the region of the resin sheet 242 is preferably covered with a mask 246, as shown in FIG. 26D. As the region of the resin sheet 242 is covered with the mask 246, the resin sheet 242 can be prevented from coming off the dicing frame 244 due to the impact caused by the carbon dioxide particles, for example. The mask 246 is made of a metal, for example.

The sample W is then moved by the conveyance mechanism, and is housed in the cassette on the cassette table 100. After that, another sample W may be taken out of the cassette, and dicing may be performed on that sample W in the same manner as above, for example.

By the above described dicing method, the resin sheet replacing unit 400 is used to inject carbon dioxide particles from the back surface side of the sample W on which burrs are easily formed. Accordingly, the effect to remove burrs is further increased, compared with the dicing method according to the first embodiment.

FIGS. 27A, 27B, 27C, 27D, and 27E are schematic cross-sectional diagrams showing the procedures in another example of a dicing method according to this embodiment.

In the sample W, a pattern formed with the base regions, the source regions, the gate insulating films, the gate electrodes, the source electrodes, and the like of vertical MOSFETs (semiconductor devices) is formed on the front surface side of a silicon substrate (a semiconductor substrate) 230 having a first surface (hereinafter referred to the front surface) and a second surface (hereinafter also referred to as the back surface). A protection film is formed on the uppermost layer. The protection film is an inorganic insulating film such as a resin film made of polyimide or the like, a silicon nitride film, or a silicon oxide film. The silicon substrate 230 is exposed through the surface of a dicing region formed on the front surface side.

Figure 27A:
FIGS. 27A, 27B, 27C, 27D, and 27E are schematic cross-sectional diagrams showing the procedures in another example of a dicing method according to the nineteenth embodiment.

A metal film 234 is formed on the back surface side of the silicon substrate 230 (FIG. 27A). The metal film 234 is the drain electrode of each MOSFET. The metal film 234 is formed with stacked films of different kinds of metals, for example. The metal film 234 is formed with stacked films of aluminum, titanium, nickel, and gold in this order from the back surface side of the silicon substrate 230, for example.

The sample W is secured to a metal dicing frame (the first dicing frame) 238. A resin sheet (the first resin sheet) 236 is bonded to the back surface side of the silicon substrate 230. The resin sheet 236 is a so-called dicing sheet. The resin sheet 236 is secured to the dicing frame 238. The resin sheet 236 is attached to the front surface of the metal film 234.

The sample W secured to the dicing frame 238 is inserted into a cassette. The cassette is placed on the cassette table 100 (FIG. 24).

The sample W is then pulled out of the cassette and is placed onto the XY table 2 of the dicing unit 200 by the conveyance mechanism. The rotary blade 4 is then positioned to the dicing region of the sample W. The rotary blade 4 is then moved down toward the sample W, so that the rotary blade 4 cuts into the sample W.

Figure 27B:
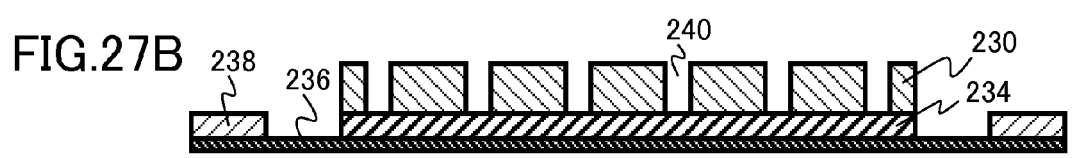

With the rotary blade 4, trenches 240 are formed along the dicing region of the sample W. The trenches 240 are formed so that the metal film 234 on the back surface is exposed, and the metal film 234 remains (FIG. 27B).

The sample W is then moved by the conveyance mechanism, and is held on the first chuck unit 6 of the resin sheet replacing unit 400. The second chuck unit 8 is then lowered, and a resin sheet (the second resin sheet) 242 is attached to the front surface side of the sample W. The resin sheet 242 is attached to the surfaces of the protection film and the metal electrodes on the front surface side. The resin sheet 242 is secured to a dicing frame (the second dicing frame) 244.

Figure 27C:
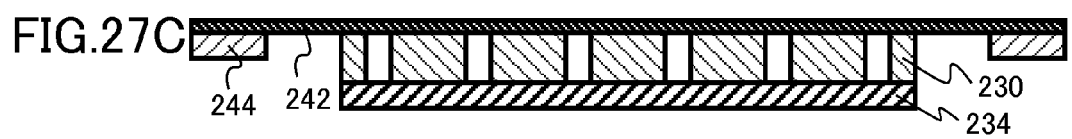

The resin sheet (first resin sheet) 236 attached to the back surface side of the sample W is then removed. The sample W is secured to the dicing frame (second dicing frame) 244 (FIG. 27C).

Figure 27D:
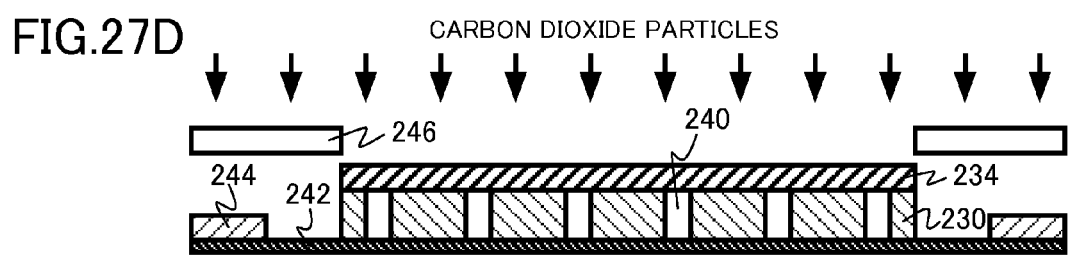

The sample W is then moved by the conveyance mechanism, and is placed on the stage 10 of the processing unit 300. Carbon dioxide particles are then injected onto the sample W from the back surface side of the silicon substrate 230 or from the side of the metal film 234 (FIG. 27D). The nozzle 216 injects carbon dioxide particle onto the opposite side from the trenches 240.

First, the dicing frame 238 is placed on the stage 10 so that the resin sheet 242 is located on the surface of the stage 10. While the nozzle 216 is linearly and two-dimensionally moved in a direction parallel to the surface of the stage 10 by the movement mechanism 218 as shown in FIG. 22B, carbon dioxide particles are injected from the nozzle 216. The nozzle 216 is moved by the movement mechanism 218 so that the carbon dioxide particles are injected onto the entire surface of the sample W.

Figure 27E:

As the carbon dioxide particles are injected, the metal film 234 on the back surface side of the trenches 240 is removed. As the metal film 234 is removed, the silicon substrate 230 is divided into MOSFETs. By virtue of the carbon dioxide particles, the metal film 234 is scraped off into the trenches 240, which are hollow portions in physical terms (FIG. 27E).

It is considered that the portions of the metal film 234 located over the trenches 240 are removed mainly by physical impact caused by carbon dioxide particles. In addition to that, it is considered that, as the metal film 234 is rapidly cooled by the low-temperature carbon dioxide particles, and the force generated by gasification and expansion of the carbon dioxide particles that have collided with the metal film 234 is applied, the effect to remove the metal film 234 by physical impact is increased.

When the carbon dioxide particles are injected, the region of the resin sheet 242 is preferably covered with a mask 246, as shown in FIG. 27D. As the region of the resin sheet 242 is covered with the mask 246, the resin sheet 242 can be prevented from coming off the dicing frame 244 due to the impact caused by the carbon dioxide particles, for example. The mask 246 is made of a metal, for example.

The sample W is then moved by the conveyance mechanism, and is housed in the cassette on the cassette table 100. After that, another sample W may be taken out of the cassette, and dicing may be performed on that sample W in the same manner as above, for example.

By the above described dicing method, the resin sheet replacing unit 400 is used, so that the metal film 234 on the back surface side of the sample W can be removed with carbon dioxide particles. Since the metal film 234 is not removed by blade dicing, generation of burrs due to peeling of the metal film 234 caused by a rotary blade can be prevented.

Like the eighteenth embodiment, this embodiment can also provide a dicing apparatus that can remove burrs and particles formed at the time of dicing of a sample as described above. Also, as the resin sheet replacing unit 400 is provided, the effect to remove burrs is increased. In some cases, generation of burrs can be prevented.

(Twentieth Embodiment)

A dicing apparatus of this embodiment further includes a washing unit that injects fluid onto a sample. The dicing apparatus of this embodiment is the same as the dicing apparatus of the eighteenth embodiment, except for including the washing unit. Therefore, the same explanations as those in the eighteenth embodiment will not be repeated.

Figure 28:
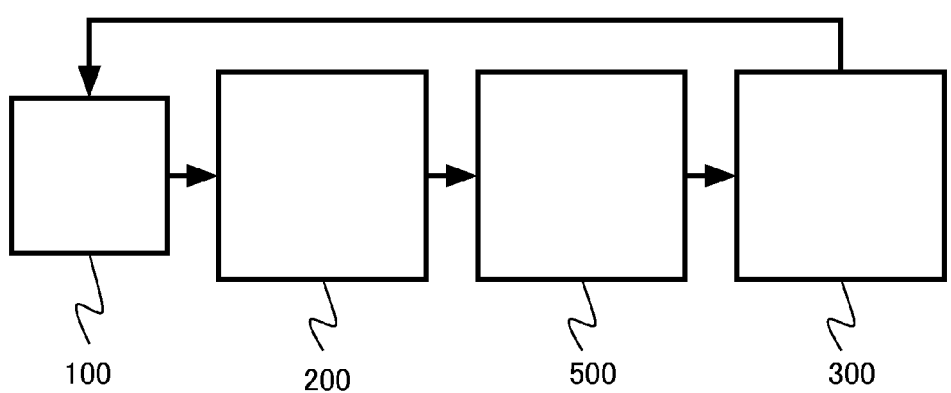
FIG. 28 is a block diagram of a dicing apparatus according to a twentieth embodiment.

FIG. 28 is a block diagram of the dicing apparatus of this embodiment. The dicing apparatus of this embodiment includes a cassette table 100, a dicing unit 200, a processing unit 300, and a washing unit 500.

The washing unit 500 has the function of removing, from a sample W, particles and the like generated at the time of dicing of the sample W with the dicing unit 200. The washing unit 500 includes a rotary stage that can rotate and have the sample W placed thereon, and a nozzle that injects fluid onto the sample W. The fluid is pure water or a mixed fluid (binary fluid) of water and a nitrogen gas, for example.

Like the eighteenth embodiment, this embodiment can provide a dicing apparatus that can remove burrs and particles formed at the time of dicing of a sample. Furthermore, as the washing unit 500 washes the sample W after blade dicing, the efficiency of removal of particles and the like is increased.

(Twenty-First Embodiment)

In a dicing apparatus of this embodiment, the processing unit includes: a stage that can have a sample placed thereon; a rotation mechanism that rotates the stage; a movement mechanism that moves the stage and the nozzle in a relative manner in a direction perpendicular to the rotation axis of the stage; and a control unit that controls the movement mechanism. In the description below, explanation of the same aspects as those of the eighteenth embodiment will not be repeated.

Figure 29A:
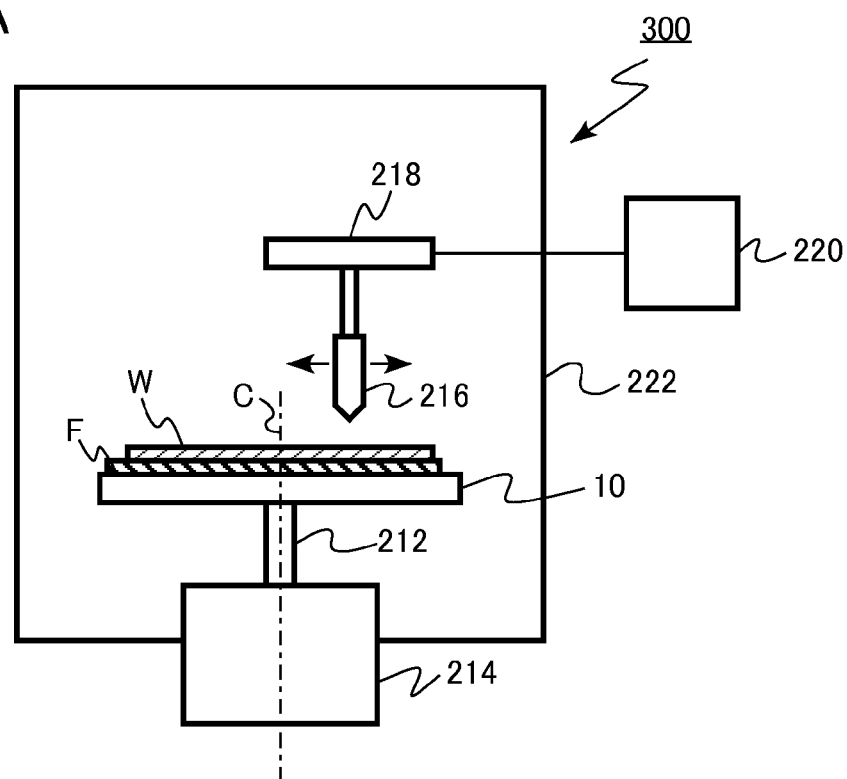
FIGS. 29A and 29B are schematic views of a processing unit according to a twenty-first embodiment.
Figure 29B:
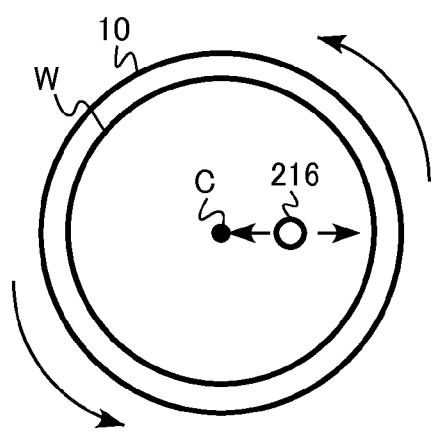

FIGS. 29A and 29B are schematic views of the processing unit of this embodiment. FIG. 29A is a schematic diagram including a cross-section of the processing unit. FIG. 29B is a top view of the stage.

The processing unit 300 of this embodiment includes a stage 10, a support shaft 212, a rotation mechanism 214, a nozzle 216, a movement mechanism 218, a control unit 220, and a processing chamber 222.

The stage 10 is designed so that the sample W to be process can be placed thereon. For example, a semiconductor wafer bonded to a dicing sheet secured to a dicing frame is placed on the stage 10.

The stage 10 is secured to the support shaft 212. The rotation mechanism 214 rotates the stage 10. The rotation mechanism 214 includes a motor and a bearing that rotatably holds the support shaft 212, for example. The stage 10 is rotated about a rotation axis C by the rotation mechanism 214.

Carbon dioxide particles are injected from the nozzle 216. The carbon dioxide particles are carbon dioxide in the solid state. The carbon dioxide particles are so-called dry ice. The form of the carbon dioxide particles may be a pellet form, a powdered form, a spherical form, or an indeterminate form, for example.

As indicated by arrows in FIGS. 29A and 29B, the movement mechanism 218 linearly moves the stage 10 and the nozzle 216 in a relative manner in a direction perpendicular to the rotation axis C of the stage 10. For example, the nozzle 216 is moved so as to scan between the rotation axis C of the stage 10 and the edge of the sample W. In the case illustrated in FIGS. 29A and 29B, the nozzle 216, not the stage 10, is moved by the movement mechanism 218.

The movement mechanism 218 is not particularly limited, as long as it can linearly scan the nozzle 216 relative to the stage 10. For example, a belt-driven movement mechanism formed with a combining of a belt, a pulley, and a motor for rotating the pulley is used. Alternatively, a combination of a rack-and-pinion mechanism and a motor is used, for example. Also, a linear motor may be used, for example.

The movement mechanism 218 may move the stage 10 relative to a fixed nozzle 216 instead of the nozzle 216.

The control unit 220 controls the movement mechanism 218. The control unit 220 controls the scanning range of the nozzle 216 on the stage 10, the velocity of the nozzle 216 relative to the stage 10, and the like to become desired values, for example. The control unit 220 may be hardware such as a circuit board, or may be a combination of hardware and software such as a control program stored in a memory. The control unit 220 may control the movement mechanism 218 in synchronization with the rotation mechanism 214. The control unit 220 also moves the stage 10 and the nozzle 216 in a relative manner in a direction parallel to the surface of the stage 10, for example.

A housing 222 houses the stage 10, the nozzle 216, the movement mechanism 218, and the like. The housing 222 protects the stage 10, the nozzle 216, the movement mechanism 218, and the like, and prevents the processing on the sample W from being affected by the external environment.

In the dicing apparatus of this embodiment, carbon dioxide particles are injected onto a sample W placed on the rotating stage 10. Accordingly, carbon dioxide particles can be injected more evenly onto the surface of the sample W than in a case where carbon dioxide particles are injected onto a sample placed on a fixed stage. Thus, burrs, particles, and the like can be evenly removed. Also, a metal film, a resin film, or the like provided on the sample W can be evenly removed.

Also, as carbon dioxide particles are injected onto a rotating sample, the velocity of the sample is added to the impact velocity of the carbon dioxide particles. Accordingly, the velocity at which the carbon dioxide particles collide with the sample W becomes higher. Thus, burrs, particles, and the like can be removed with high efficiency. Also, a metal film, a resin film, or the like provided on the sample W can be removed with high efficiency.

Like the eighteenth embodiment, this embodiment can provide a dicing apparatus that can remove burrs and particles formed at the time of dicing of a sample. Also, burrs, particles, and the like can be evenly removed with high efficiency. Furthermore, the metal film or the resin film can be evenly removed with high efficiency.

(Twenty-Second Embodiment)

A dicing apparatus of this embodiment is the same as the dicing apparatus of the twenty-first embodiment, except that the control unit of the processing unit controls the velocity of the relative movement of the stage and the nozzle to become lower as the distance from the rotation axis of the stage to the nozzle becomes longer. Therefore, the same explanations as those in the twenty-first embodiment will not be repeated.

Figure 30A:
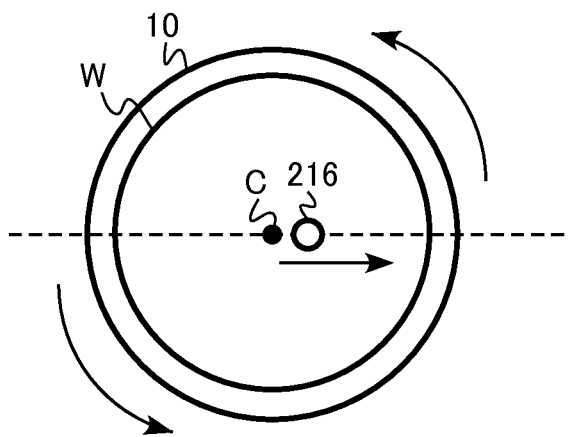
FIGS. 30A and 30B are diagrams for explaining the functions of a processing unit according to a twenty-second embodiment.
Figure 30B:
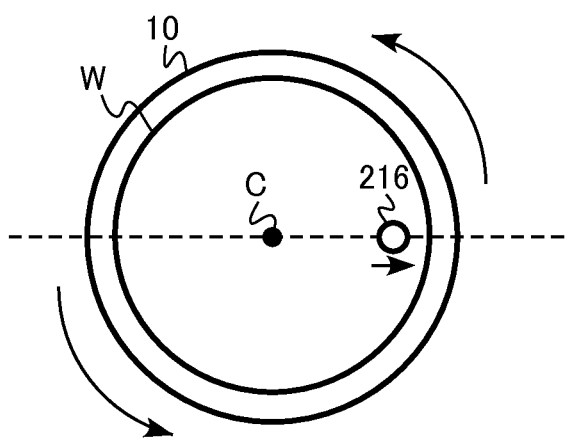

FIGS. 30A and 30B are diagrams for explaining the functions of the processing unit of this embodiment. FIG. 30A is a diagram illustrating a case where the distance from the rotation axis C of the stage 10 to the nozzle 216 is short. FIG. 30B is a diagram illustrating a case where the distance from the rotation axis C of the stage 10 to the nozzle 216 is long.

In this embodiment, in a case where the distance from the rotation axis C of the stage 10 to the nozzle 216 is short as shown in FIG. 30A, the moving velocity of the nozzle 216 is increased. In a case where the distance from the rotation axis C of the stage 10 to the nozzle 216 is long as shown in FIG. 30B, the moving velocity of the nozzle 216 is decreased. The lengths of arrows shown in FIGS. 30A and 30B indicate the difference between the moving velocities.

If the moving velocity of the nozzle 216 is fixed, regardless of the distance from the rotation axis C of the stage 10 to the nozzle 216, the amount of carbon dioxide particles to be injected per unit area of a sample W located in a region at a long distance from the rotation axis C might be smaller than the amount of carbon dioxide particles to be injected per unit area of the sample W located in a region at a short distance from the rotation axis C.

According to this embodiment, the amount of carbon dioxide particles to be injected per unit area of a sample W can be made substantially uniform, regardless of the distance from the rotation axis C. Accordingly, the evenness of the processing of the sample W can be further increased. Specifically, the evenness in removing burrs, particles, and the like is increased, for example. Also, specifically, the evenness in removing the metal film or the resin film is increased, for example.

(Twenty-Third Embodiment)

A dicing apparatus of this embodiment is the same as the dicing apparatus of the twenty-first embodiment, except that the processing unit includes a tilt mechanism that changes the angle of tilt of the nozzle with respect to the surface of the stage. Therefore, the same explanations as those in the twenty-first embodiment will not be repeated.

Figure 31A:
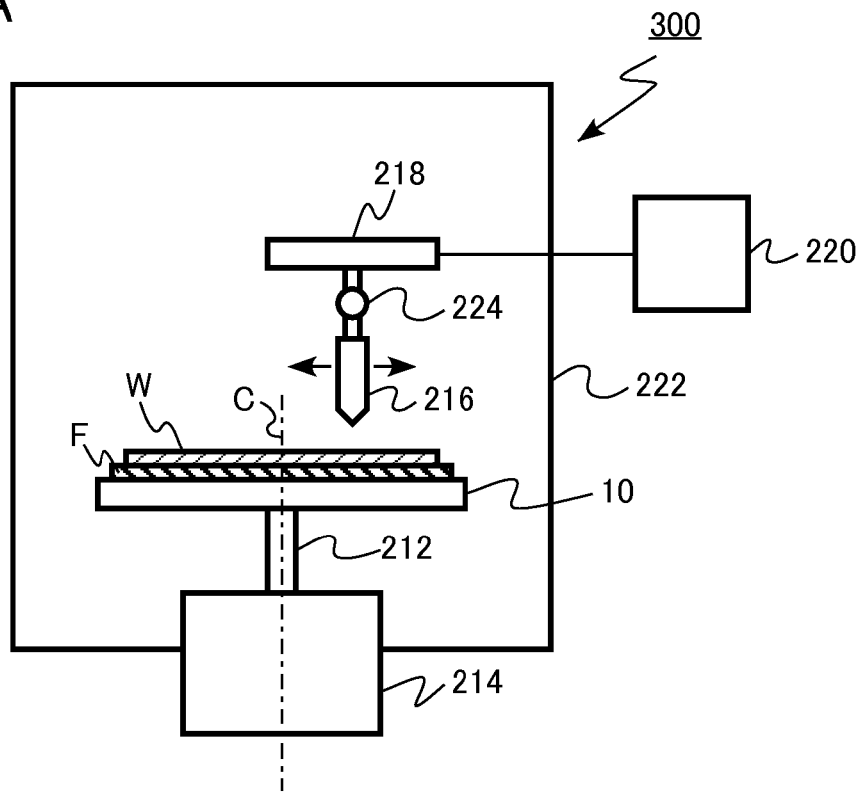
FIGS. 31A and 31B are schematic views of a processing unit according to a twenty-third embodiment.
Figure 31B:
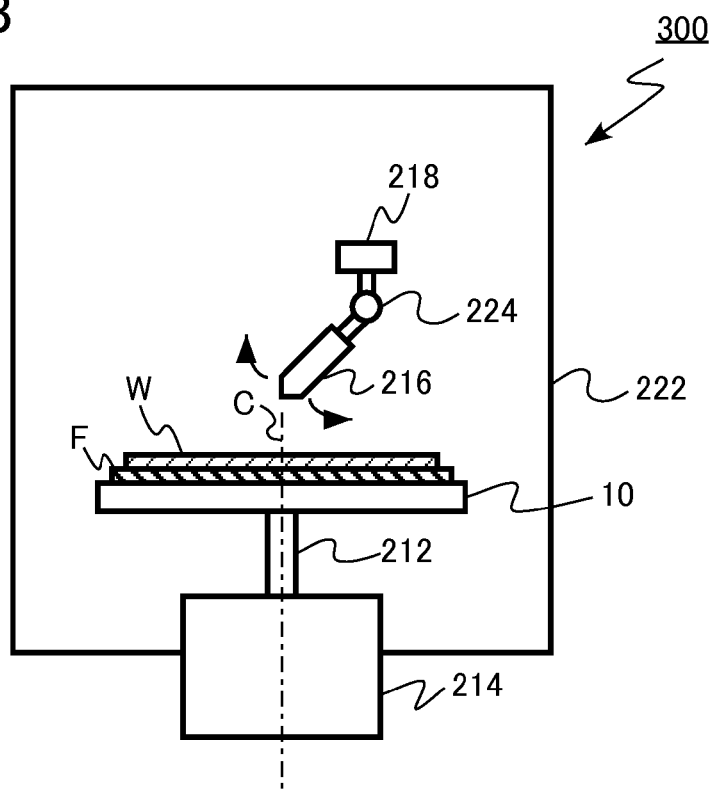

FIGS. 31A and 31B are schematic views of the processing unit of this embodiment. FIG. 31A is a schematic view including a cross-section of the processing unit. FIG. 31B is a schematic view including a cross-section in a direction perpendicular to the cross-section shown in FIG. 31A.

The processing unit 300 of this embodiment includes a tilt mechanism 224. The tilt mechanism 224 changes the angle of tilt of the nozzle 216 with respect to the surface of the stage 10. The angle of tilt of the tilt mechanism 224 is controlled by the control unit 220, for example.

The tilt mechanism 224 is a rotational tilt mechanism formed with a combination of a rotary shaft and a stepping motor, for example. The angle of tilt of the nozzle 216 is preferably controlled so that the impact velocity of carbon dioxide particles colliding with the surface of a rotating sample W becomes higher than that in a case where the angle of tilt is 90 degrees. Specifically, the angle of tilt of the nozzle 216 is preferably set so that the orientation of the injected carbon dioxide particles on the surface of the sample W is the opposite of the orientation of the rotational movement of the surface of the sample W.

By a manufacturing method using the processing unit 300 of this embodiment, carbon dioxide particles are injected onto the sample W, while the angle of tilt of the nozzle 216 with respect to the surface of the stage 10 is maintained at a smaller angle than 90 degrees, such as an angle not smaller than 15 degrees and not larger than 45 degrees.

According to this embodiment, the injecting of carbon dioxide particles has a horizontal-direction component with respect to the surface of the sample W. Therefore, the burrs, particles, and metal film or resin film or the like removed by the carbon dioxide particles do not easily enter the trenches for dicing. Accordingly, the removed burrs, particles, and metal film or resin film can be prevented from turning into residues in the trenches. Also, as the impact velocity of the carbon dioxide particles onto the sample W can be increased, the burrs, the particles, and the metal film or the resin film can be removed with higher efficiency. Furthermore, as the angle of tilt can be set at a desired value, an optimum processing condition for the sample W can be set.

Alternatively, the angle of tilt of the nozzle 216 with respect to the surface of the stage 10 may be fixed at a smaller angle than 90 degrees. With this structure, the burrs, particles, and metal film or resin film removed by the carbon dioxide particles can also be prevented from entering the trenches for dicing and turning into residues in the trenches. Also, as the impact velocity of the carbon dioxide particles onto the sample W can be increased, the burrs, the particles, and the metal film or the resin film can be removed with higher efficiency.

(Twenty-Fourth Embodiment)

A dicing apparatus of this embodiment is the same as the dicing apparatus of the twenty-first embodiment, except that the processing unit includes an inlet provided in the housing and outlets provided in the housing. Therefore, the same explanations as those in the twenty-first embodiment will not be repeated.

Figure 32:
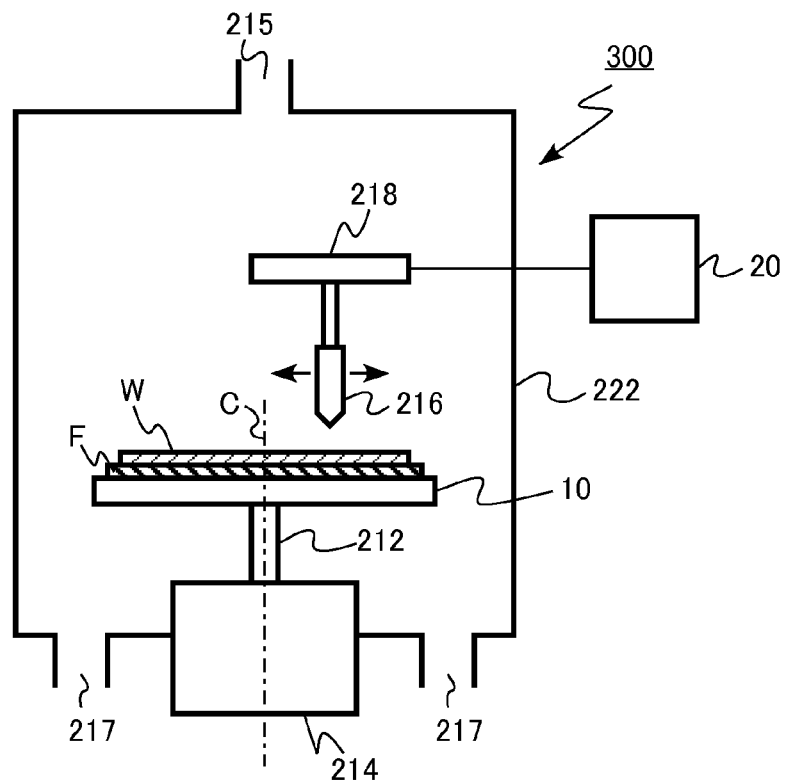
FIG. 32 is a schematic view of a processing unit according to a twenty-fourth embodiment.

FIG. 32 is a schematic view of the processing unit of this embodiment. FIG. 32 is a schematic view including a cross-section of the processing unit 300.

The processing unit 300 of this embodiment includes an inlet 215 provided in the housing 222, and outlets 217 provided in the housing 222. The inlet 215 is provided at an upper portion of the housing 222, for example, and the outlets 217 are provided at lower portions of the housing 222, for example.

Gaseous matter such as the air or a nitrogen gas is supplied into the housing 222 through the inlet 215, and is discharged through the outlets 217. A pump (not shown) is connected to the outlets 217, for example, and exhausts the gaseous matter in the housing 222. The gaseous matter flows downward in the housing 222. Accordingly, a so-called downflow can be formed in the housing 222.

According to this embodiment, the burrs, particles, and metal film or resin film removed by carbon dioxide particles are discharged through the outlets 217 by virtue of the flow of the gaseous matter in the housing 222. Accordingly, the removed burrs, particles, and metal film or resin film can be prevented from re-adhering to the sample W, or entering the trenchs for dicing and turning into residues in the trenchs.

(Twenty-Fifth Embodiment)

A dicing apparatus of this embodiment is the same as the dicing apparatus of the twenty-first embodiment, except that the processing unit includes a cooling mechanism that cools the atmosphere in the housing. Therefore, the same explanations as those in the twenty-first embodiment will not be repeated.

Figure 33:
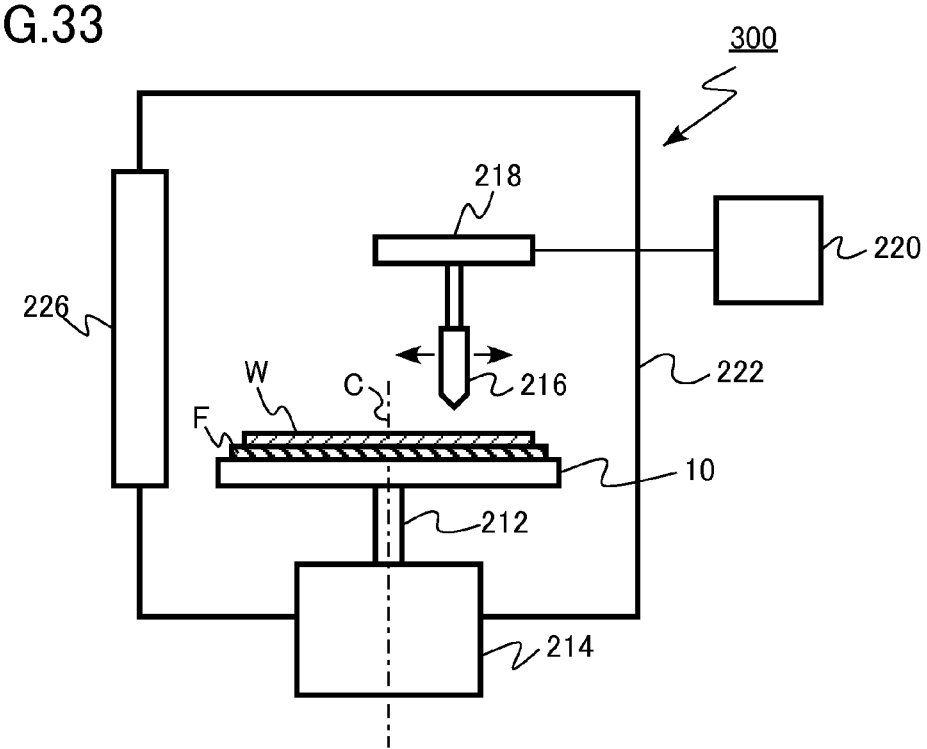
FIG. 33 is a schematic view of a processing unit according to a twenty-fifth embodiment.

FIG. 33 is a schematic view of the processing unit of this embodiment. FIG. 33 is a schematic view including a cross-section of the processing unit 300.

The processing unit 300 of this embodiment includes a cooling mechanism 226 that cools the atmosphere in the housing 222 As the cooling mechanism 226, a heat pump is used, for example.

According to this embodiment, the temperature in the housing 222 is lowered to prevent gasification of the carbon dioxide particles injected from the nozzle. Accordingly, the efficiency of the removal of burrs, particles, and the metal film or the resin film is increased.

(Twenty-Sixth Embodiment)

A dicing apparatus of this embodiment is the same as the dicing apparatus of the twenty-first embodiment, except that the processing unit includes more than one nozzle. Therefore, the same explanations as those in the twenty-first embodiment will not be repeated.

Figure 34:
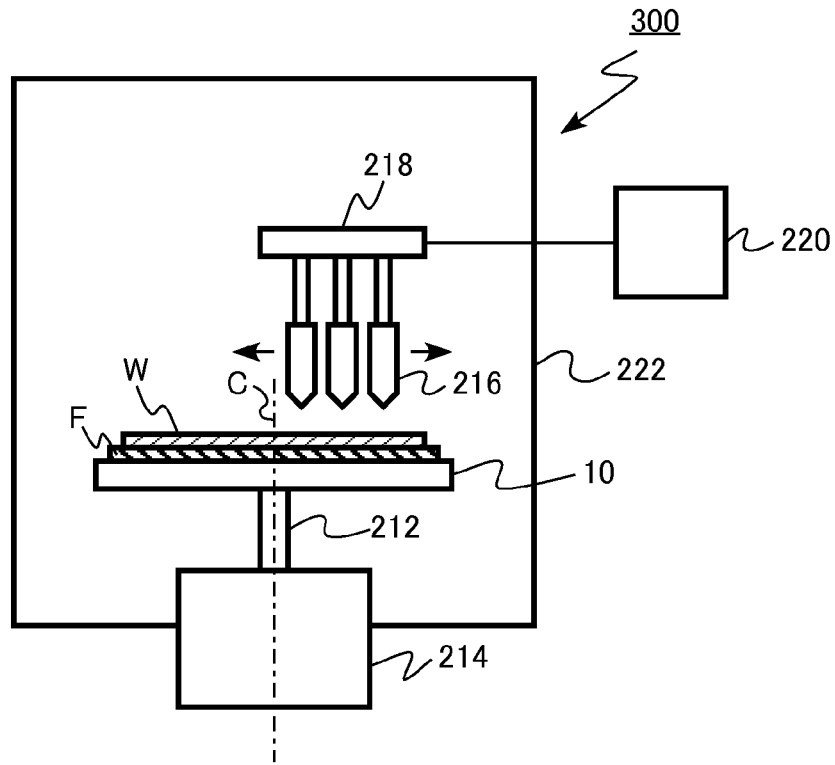
FIG. 34 is a schematic view of a processing unit according to a twenty-sixth embodiment.

FIG. 34 is a schematic view of the processing unit of this embodiment. FIG. 34 is a schematic view including a cross-section of the processing unit 300.

As shown in FIG. 34, the processing unit 300 of this embodiment includes three nozzles 216. The number of nozzles 216 is not limited to three, as long as it is two or larger.

According to this embodiment, the productivity of processing can be increased by virtue of the nozzles 216.

(Twenty-Seventh Embodiment)

A dicing apparatus of this embodiment is the same as the dicing apparatus of the twenty-first embodiment, except that the processing unit includes a movement mechanism that moves the stage and the nozzle in a relative manner in the direction of the rotation axis of the stage. Therefore, the same explanations as those in the twenty-first embodiment will not be repeated.

Figure 35:
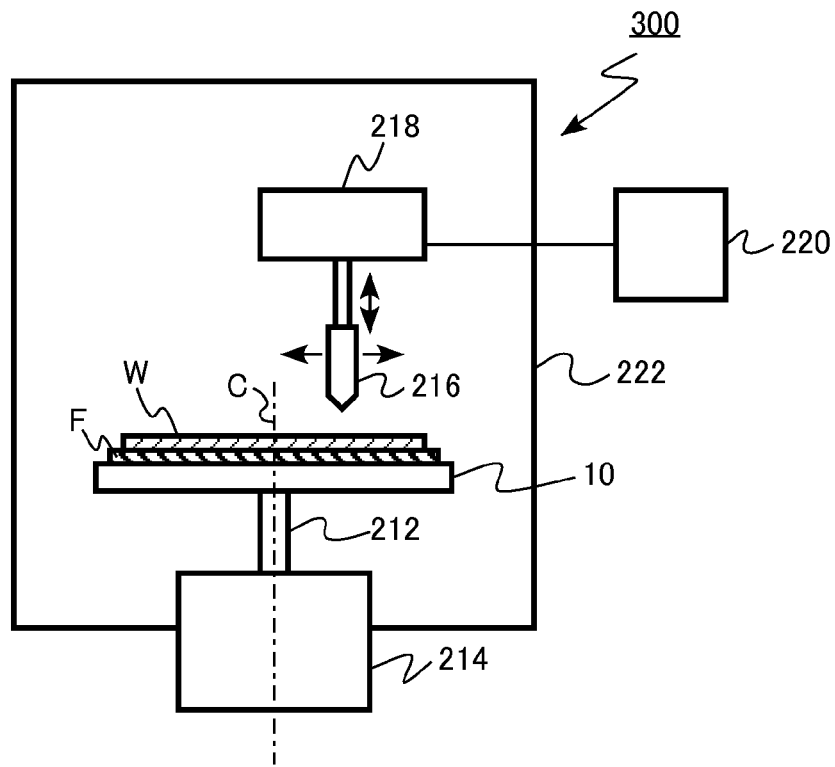
FIG. 35 is a schematic view of a processing unit according to a twenty-seventh embodiment.

FIG. 35 is a schematic view of the processing unit of this embodiment. FIG. 35 is a schematic view including a cross-section of the processing unit.

As shown in FIG. 35, the processing unit 300 of this embodiment includes a movement mechanism 218 that moves the stage 10 and the nozzle 216 in a relative manner in the direction the rotation axis of the stage 10. Here, the movement mechanism 218 also has the function of moving the stage 10 and the nozzle 216 in a relative manner in a direction perpendicular to the rotation axis C of the stage 10. A movement mechanism that moves the stage 10 and the nozzle 216 in a relative manner in the direction of the rotation axis of the stage 10 may be employed as a movement mechanism independent of the movement mechanism that moves the stage 10 and the nozzle 216 in a direction perpendicular to the rotation axis C of the stage 10.

According to this embodiment, the distance between the stage 10 and the nozzle 216 can be set at a desired value, and accordingly, an optimum processing condition for the sample W can be set.

(Twenty-Eighth Embodiment)

In a dicing apparatus of this embodiment, the processing unit includes: a stage that has a surface tilting with respect to a plane perpendicular to the direction of gravitational force, and can have a sample placed on the surface; a housing that houses the stage and the nozzle; a movement mechanism that moves the stage and the nozzle in a relative manner in a direction parallel to the surface of the stage; and a control unit that controls the movement mechanism. In the description below, explanation of the same aspects as those of the eighteenth embodiment will not be repeated.

Figure 36A:
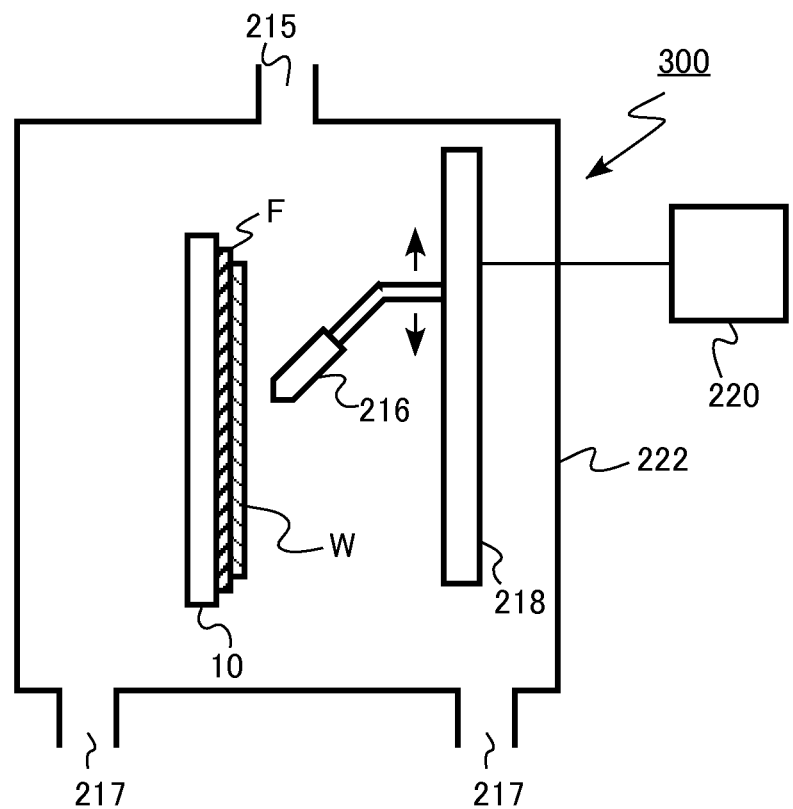
FIGS. 36A and 36B are schematic views of a processing unit according to a twenty-eighth embodiment.
Figure 36B:
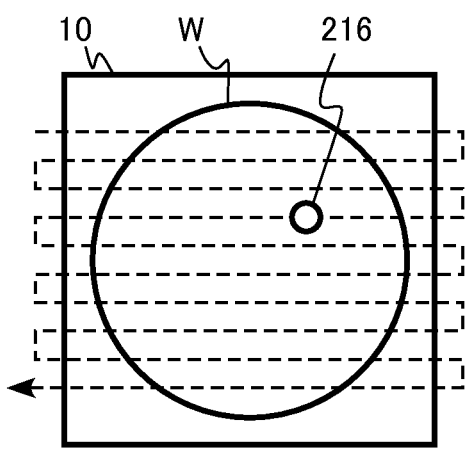

FIGS. 36A and 36B are schematic views of the processing unit of this embodiment. FIG. 36A is a schematic diagram including a cross-section of the processing unit. FIG. 36B is a top view of the stage.

The processing unit 300 of this embodiment includes a stage 10, a nozzle 216, a housing 222, an inlet 215, outlets 217, a movement mechanism 218, and a control unit 220.

The stage 10 is designed so that the sample W to be process can be placed thereon. The sample W secured to a dicing frame F, for example, is placed on the stage 10.

The surface of the stage 10 tilts with respect to a plane perpendicular to the direction of gravitational force. In FIG. 36A, the surface of the stage 10 tilts at 90 degrees with respect to a plane perpendicular to the direction of gravitational force. The tilt angle of the surface of the stage 10 with respect to a plane perpendicular to the direction of gravitational force may not be 90 degrees.

Carbon dioxide particles for removing the metal film are injected from the nozzle 216. The carbon dioxide particles are carbon dioxide in the solid state. The carbon dioxide particles are so-called dry ice. The form of the carbon dioxide particles may be a pellet form, a powdered form, a spherical form, or an indeterminate form, for example.

The movement mechanism 218 linearly and two-dimensionally moves the stage 10 and the nozzle 216 in a relative manner in a direction parallel to the surface of the stage 10. As indicated by an arrow and a dashed line in FIG. 36B, the nozzle 216 is moved so as to scan the entire surface of the sample W placed on the stage 10. In the case illustrated in FIGS. 36A and 36B, the nozzle 216, not the stage 10, is moved by the movement mechanism 218.

The movement mechanism 218 is not particularly limited, as long as it can two-dimensionally move the nozzle 216 relative to the stage 10. For example, a belt-driven movement mechanism formed with a combining of a belt, a pulley, and a motor for rotating the pulley is used. Alternatively, a combination of a rack-and-pinion mechanism and a motor is used, for example. Also, a linear motor may be used, for example.

The control unit 220 controls the movement mechanism 218. The control unit 220 controls the scanning range of the nozzle 216 on the stage 10, the velocity of the nozzle 216 relative to the stage 10, and the like to become desired values, for example. The control unit 220 may be hardware such as a circuit board, or may be a combination of hardware and software such as a control program stored in a memory.

A housing 222 houses the stage 10, the nozzle 216, the movement mechanism 218, and the like. The housing 222 protects the stage 10, the nozzle 216, the movement mechanism 218, and the like, and prevents the processing on the sample W from being affected by the external environment.

The inlet 215 is provided at an upper portion of the housing 222, for example, and the outlets 217 are provided at lower portions of the housing 222, for example.

Gaseous matter such as the air or a nitrogen gas is supplied into the housing 222 through the inlet 215, and is discharged through the outlets 217. A pump (not shown) is connected to the outlets 217, for example, and exhausts the gaseous matter in the housing 222. The gaseous matter flows downward in the housing 222. Accordingly, a so-called downflow can be formed in the housing 222.

In the dicing apparatus of this embodiment, the surface of the stage 10 tilts with respect to a plane perpendicular to the direction of gravitational force. As the inlet 215 and the outlets 217 are provided, a controlled airflow is formed in the housing 222. With this structure, the burrs, particles, and metal film or resin film removed by carbon dioxide particles are discharged through the outlets 217 by virtue of the flow of the gaseous matter in the housing 222. Accordingly, the removed burrs, particles, and metal film or resin film can be prevented from re-adhering to the sample W, or entering the trenchs for dicing and turning into residues in the trenchs.

So as to prevent the removed burrs, particles, and metal film or resin film from re-adhering to the sample W, the nozzle 216 preferably tilts in the direction of gravitational force, rather than in the direction of a horizontal plane, as shown in FIG. 36A.

As described above, with the dicing apparatus of this embodiment, the same effects as those of the eighteenth embodiment can be achieved, and furthermore, the removed burrs, particles, and metal film or resin film can be prevented from re-adhering to the sample or remaining as residues.

(Twenty-Ninth Embodiment)

A dicing apparatus of this embodiment is the same as the dicing apparatus of the twenty-eighth embodiment, except that the processing unit includes a first tilt mechanism that changes the angle of tilt of the surface of the stage with respect to a plane perpendicular to the direction of gravitational force, and the movement mechanism moves the stage, instead of the nozzle. Therefore, the same explanations as those in the twenty-eighth embodiment will not be repeated.

Figure 37:
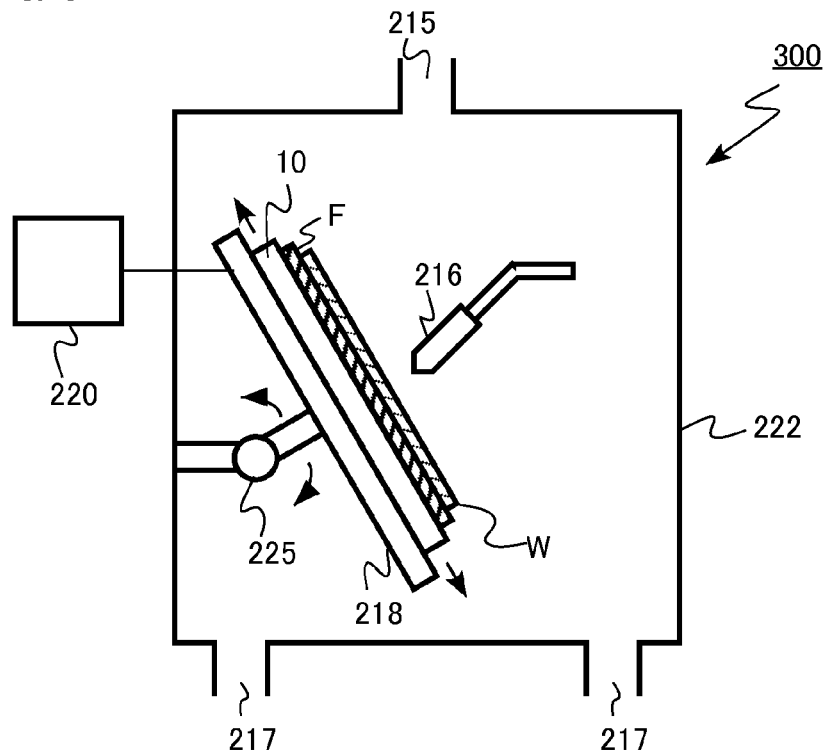
FIG. 37 is a schematic view of a processing unit according to a twenty-ninth embodiment.

FIG. 37 is a schematic view of the processing unit of this embodiment. FIG. 37 is a schematic view including a cross-section of the processing unit.

The processing unit 300 of this embodiment includes a first tilt mechanism 225. The first tilt mechanism 225 changes the angle of tilt of the surface of the stage 10 with respect to a plane perpendicular to the direction of gravitational force. The angle of tilt of the first tilt mechanism 225 is controlled by the control unit 220, for example.

The first tilt mechanism 225 is a rotational tilt mechanism formed with a combination of a rotary shaft and a stepping motor, for example. The angle of tilt of the stage 10 can be set so that the removed metal film or resin film can be efficiently transported by the airflow formed by the inlet 215 and the outlets 217 in the housing 222.

In this embodiment, the movement mechanism 218 two-dimensionally moves the stage 10, instead of the nozzle 216. The nozzle 216 is secured.

According to this embodiment, the same effects as those of the twenty-eighth embodiment are achieved. In addition to that, the angle of tilt of the stage 10 can be set at a desired value, so as to prevent the removed burrs, particles, and metal film or resin film from re-adhering to the sample or turning into residues in the trenchs. Accordingly, an optimum processing condition for the sample W can be set.

(Thirtieth Embodiment)

A dicing apparatus of this embodiment is the same as the dicing apparatus of the twenty-eighth embodiment, except that the processing unit includes a cooling mechanism that cools the atmosphere in the housing. Therefore, the same explanations as those in the twenty-eighth embodiment will not be repeated.

Figure 38:
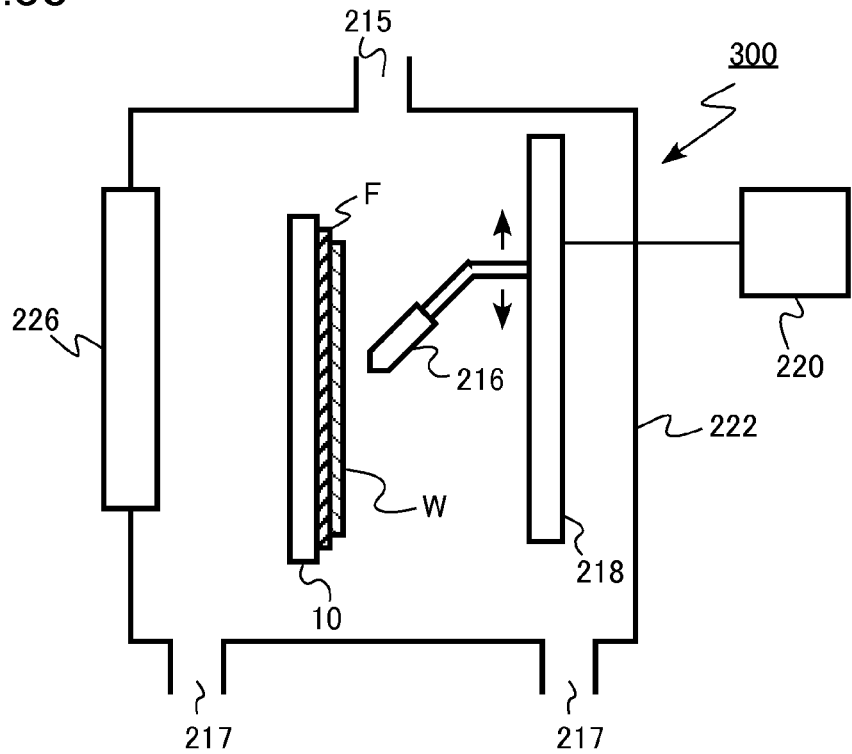
FIG. 38 is a schematic view of a processing unit according to a thirtieth embodiment.

FIG. 38 is a schematic view of the processing unit of this embodiment. FIG. 38 is a schematic view including a cross-section of the processing unit.

The processing unit 300 of this embodiment includes a cooling mechanism 226 that cools the atmosphere in the housing 222 As the cooling mechanism 226, a heat pump is used, for example.

According to this embodiment, the temperature in the housing 222 is lowered to prevent gasification of the carbon dioxide particles injected from the nozzle. Accordingly, the efficiency of the removal of burrs, particles, and the metal film or the resin film is increased. Also, as the temperature in the housing 222 is maintained at a predetermined temperature not higher than room temperature, the sample W can be processed with excellent reproducibility.

(Thirty-First Embodiment)

A dicing apparatus of this embodiment is the same as the dicing apparatus of the twenty-eighth embodiment, except that the processing unit includes a second tilt mechanism that changes the angle of tilt of the nozzle with respect to the surface of the stage. Therefore, the same explanations as those in the twenty-eighth embodiment will not be repeated.

Figure 39:
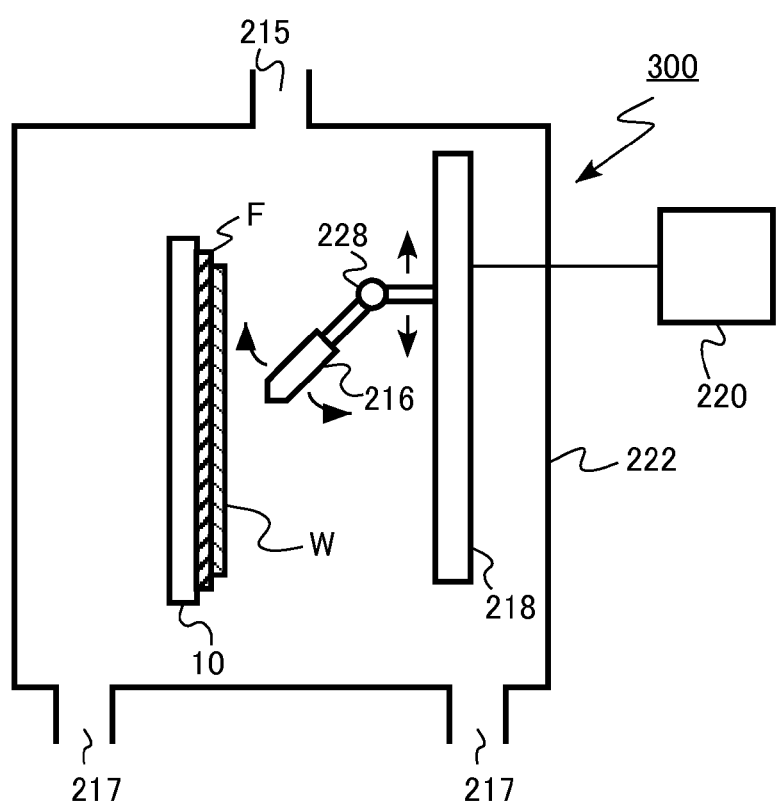
FIG. 39 is a schematic view of a processing unit according to a thirty-first embodiment.

FIG. 39 is a schematic view of the processing unit of this embodiment. FIG. 39 is a schematic view including a cross-section of the processing unit.

The processing unit 300 of this embodiment includes a second tilt mechanism 228. The second tilt mechanism 228 changes the angle of tilt of the nozzle 216 with respect to the surface of the stage 10. The angle of tilt of the second tilt mechanism 228 is controlled by the control unit 220, for example.

The second tilt mechanism 228 is a rotational tilt mechanism formed with a combination of a rotary shaft and a stepping motor, for example. The angle of tilt of the nozzle 216 can be set as an optimum condition for removing the metal film or the resin film of the sample W.

By a manufacturing method using the dicing apparatus of this embodiment, carbon dioxide particles are injected onto the sample W, while the angle of tilt of the nozzle 216 with respect to the surface of the stage 10 is maintained at a smaller angle than 90 degrees, such as an angle not smaller than 15 degrees and not larger than 45 degrees.

According to this embodiment, the same effects as those of the twenty-eighth embodiment are achieved. In addition to that, the angle of tilt of the nozzle 216 can be set at a desired value, so as to prevent the removed burrs, particles, and metal film or resin film from re-adhering to the sample or turning into residues in the trenchs. Accordingly, an optimum processing condition for the sample W can be set.

Alternatively, the angle of tilt of the nozzle 216 with respect to the surface of the stage 10 may be fixed at a smaller angle than 90 degrees. With this structure, the metal film or the resin film removed by the carbon dioxide particles can also be prevented from re-adhering to the sample W, or entering the trenchs for dicing and turning into residues.

(Thirty-Second Embodiment)

A dicing apparatus of this embodiment is the same as the dicing apparatus of the twenty-eighth embodiment, except that the processing unit includes a rotation mechanism that rotates the stage, and the nozzle is one-dimensionally moved by the movement mechanism. Therefore, the same explanations as those in the twenty-eighth embodiment will not be repeated.

Figure 40A:
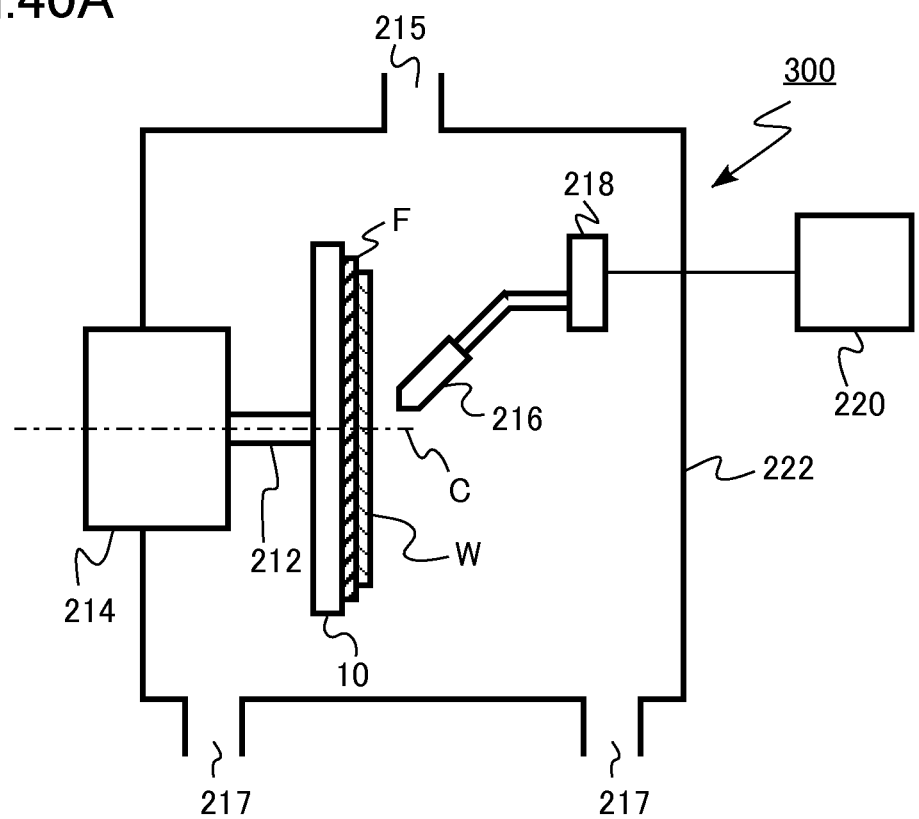
FIGS. 40A and 40B are schematic views of a processing unit according to a thirty-second embodiment.
Figure 40B:
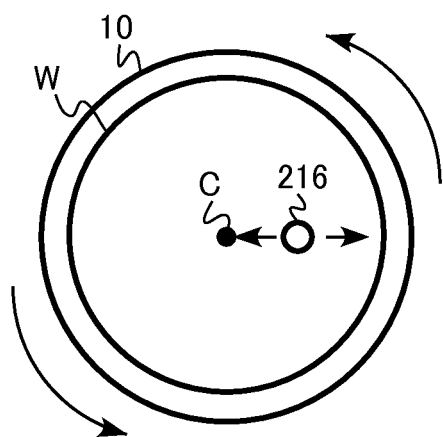

FIGS. 40A and 40B are schematic views of the processing unit of this embodiment. FIG. 40A is a schematic diagram including a cross-section of the processing unit. FIG. 40B is a top view of the stage.

The processing unit 300 of this embodiment further includes a support shaft 212 and a rotation mechanism 214.

The stage 10 is secured to the support shaft 212. The rotation mechanism 214 rotates the stage 10. The rotation mechanism 214 includes a motor and a bearing that rotatably holds the support shaft 212, for example. The stage 10 is rotated about a rotation axis C by the rotation mechanism 214.

As indicated by arrows in FIG. 40B, the movement mechanism 218 linearly moves the stage 10 and the nozzle 216 in a relative manner in a direction perpendicular to the rotation axis C of the stage 10. For example, the nozzle 216 is moved so as to scan between the rotation axis C of the stage 10 and the edge of a sample W. In the case illustrated in FIGS. 40A and 40B, the nozzle 216, not the stage 10, is moved by the movement mechanism 218.

The movement mechanism 218 is not particularly limited, as long as it can linearly scan the nozzle 216 relative to the stage 10. For example, a belt-driven movement mechanism formed with a combining of a belt, a pulley, and a motor for rotating the pulley is used. Alternatively, a combination of a rack-and-pinion mechanism and a motor is used, for example. Also, a linear motor may be used, for example.

In the dicing apparatus of this embodiment, carbon dioxide particles are injected onto a sample placed on the rotating stage 10. Accordingly, carbon dioxide particles can be injected more evenly onto the surface of the sample W than in a case where carbon dioxide particles are injected onto a sample placed on a fixed stage. Thus, the same effects as those of the eleventh embodiment are achieved, and in addition to that, burrs, particles, and the metal film or the resin film can be evenly removed.

Also, as carbon dioxide particles are injected onto a rotating sample, the velocity of the sample is added to the impact velocity of the carbon dioxide particles. Accordingly, the velocity at which the carbon dioxide particles collide with burrs, particles, and the metal film or the resin film becomes higher. Thus, burrs, particles, and the metal film or the resin film can be removed with high efficiency.

(Thirty-Third Embodiment)

A dicing apparatus of this embodiment is the same as the dicing apparatus of the twenty-eighth embodiment, except that the processing unit includes more than one nozzle. Therefore, the same explanations as those in the twenty-eighth embodiment will not be repeated.

Figure 41:
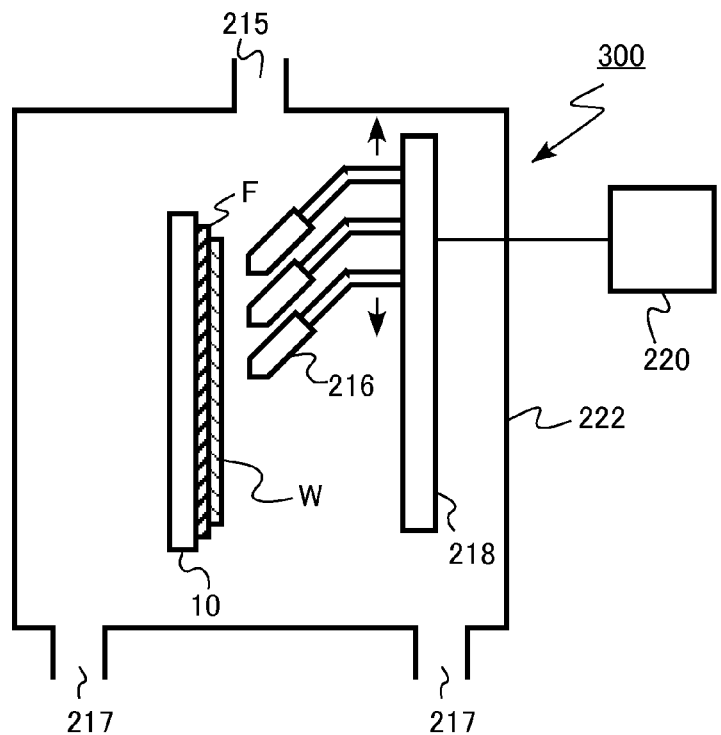
FIG. 41 is a schematic view of a processing unit according to a thirty-third embodiment.

FIG. 41 is a schematic view of the processing unit of this embodiment. FIG. 41 is a schematic view including a cross-section of the processing unit.

As shown in FIG. 41, the processing unit 300 of this embodiment includes three nozzles 216. The number of nozzles 216 is not limited to three, as long as it is two or larger.

According to this embodiment, the productivity of processing can be increased by virtue of the nozzles 216.

(Thirty-Fourth Embodiment)

A dicing apparatus of this embodiment is the same as the dicing apparatus of the twenty-eighth embodiment, except that the processing unit includes a movement mechanism that moves the stage and the nozzle in a relative manner in a direction perpendicular to the surface of the stage. Therefore, the same explanations as those in the twenty-eighth embodiment will not be repeated.

Figure 42:
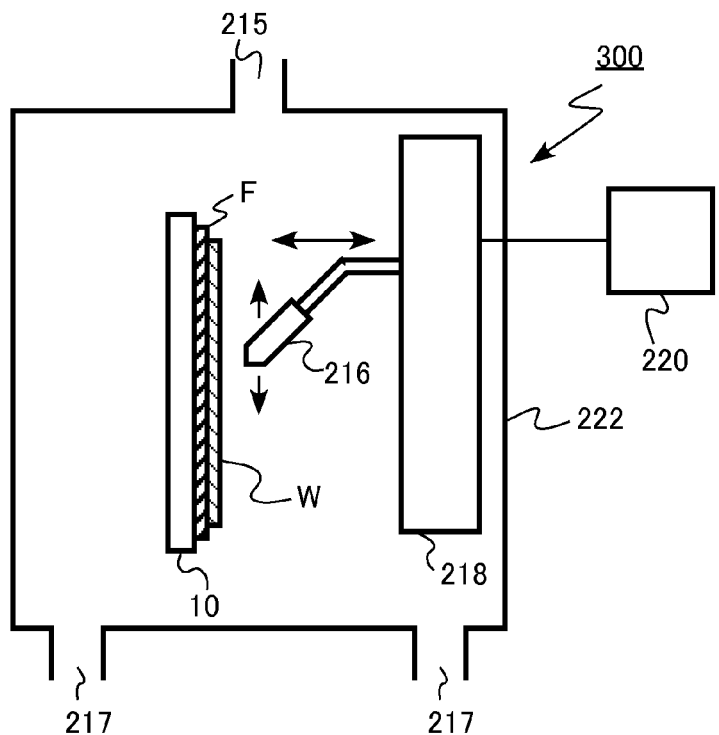
FIG. 42 is a schematic view of a processing unit according to a thirty-fourth embodiment.

FIG. 42 is a schematic view of the processing unit of this embodiment. FIG. 42 is a schematic view including a cross-section of the processing unit.

As shown in FIG. 42, the processing unit 300 of this embodiment includes a movement mechanism 218 that moves the stage 10 and the nozzle 216 in a relative manner in a direction perpendicular to the surface of the stage 10. Here, the movement mechanism 218 also has the function of moving the stage 10 and the nozzle 216 in a relative manner in a direction parallel to the surface of the stage 10. A movement mechanism that moves the stage 10 and the nozzle 216 in a relative manner in a direction perpendicular to the surface of the stage 10 may be employed as a movement mechanism independent of the movement mechanism that moves the stage 10 and the nozzle 216 in a direction parallel to the surface of the stage 10.

According to this embodiment, the distance between the stage 10 and the nozzle 216 can be set at a desired value, and accordingly, an optimum processing condition for the sample W can be set.

(Thirty-Fifth Embodiment)

In a dicing apparatus of this embodiment, the dicing unit includes a laser oscillator that emits laser light to form a trench in a sample. Except for the dicing unit, the dicing apparatus of this embodiment is the same as the dicing apparatus of the eighteenth embodiment. Therefore, the same explanations as those in the eighteenth embodiment will not be repeated.

Figure 43:
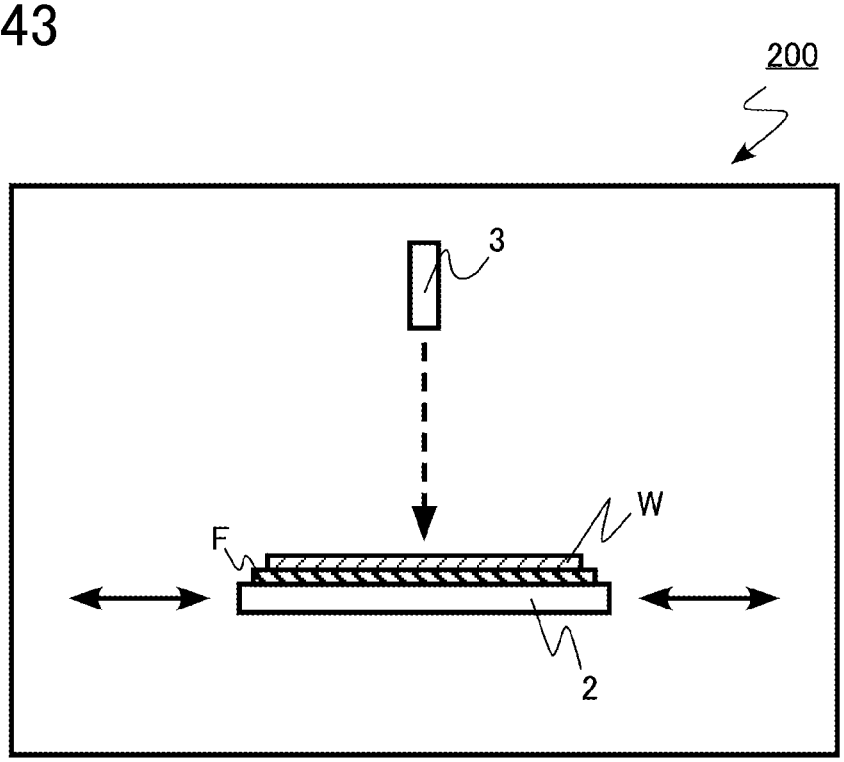
FIG. 43 is a schematic view of a dicing unit according to a thirty-fifth embodiment.

FIG. 43 is a schematic view of the dicing unit of this embodiment. The dicing unit 200 has the function of forming trenches in the dicing region of a sample W.

The dicing unit 200 includes an XY table 2 and a laser oscillator 3. The sample W is placed on the XY table 2. The XY table 2 moves in a two-dimensional plane. The laser oscillator 3 emits laser light.

The dicing unit 200 forms trenches in the sample W by irradiating the sample W with laser light, or cuts the sample W by forming trenchs.

In a case where the sample W is diced with laser light, solidified matter of the sample W melted by the laser light might adhere as debris to the sample W. In a case where the sample W is a semiconductor substrate, for example, solidified matter of the semiconductor substrate melted by laser light, or solidified matter of the metal film or the resin film provided on the semiconductor substrate and melted by laser light adheres as debris to the semiconductor substrate.

The debris adhering to the sample W might cause packaging defects among semiconductor chips divided by dicing, for example, and the production yield might become lower.

After forming trenches along the dicing region of the sample W, the dicing apparatus of this embodiment injects carbon dioxide particles from the front surface side of the sample W, to remove the debris adhering to the sample W.

As described above, this embodiment can provide a dicing apparatus that can remove debris formed at the time of dicing of a sample with laser light.

In each of the example cases described in the eighteenth through thirty-fifth embodiments, the nozzle injects a substance to part of a sample, and the stage and the nozzle are moved in a relative manner so that the entire sample is processed. However, the nozzle can be designed to inject a substance to the entire surface of the sample so that the entire sample can be processed at once, for example. The nozzle capable of processing an entire sample at once can be produced by adjusting the nozzle diameter to the size of the sample or combining a large number of nozzles, for example.

While certain embodiments have been described, these embodiments have been presented by way of example only, and are not intended to limit the scope of the inventions. Indeed, the processing apparatus, the nozzle, and the dicing apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A processing apparatus comprising:
   a stage capable of having a sample placed thereon; and
   a nozzle dividing the sample by injecting carbon dioxide particles onto the sample, the carbon dioxide particles being in solid state, the carbon dioxide particles removing one of a metal film and a resin film provided on the sample, wherein a mean particle size of the carbon dioxide particles is not smaller than 10 μm and not greater than 200 μm, and a spot diameter of the carbon dioxide particles on a surface of the one of the metal film and the resin film when the carbon dioxide particles are injected onto the one of the metal film and the resin film is not smaller than 3 mm and not greater than 10 mm.

2. A nozzle dividing a sample by injecting carbon dioxide particles onto the sample, the carbon dioxide particles being in solid state, the carbon dioxide particles removing one of a metal film and a resin film provided on the sample, wherein a mean particle size of the carbon dioxide particles is not smaller than 10 μm and not greater than 200 μm, and a spot diameter of the carbon dioxide particles on a surface of the one of the metal film and the resin film when the carbon dioxide particles are injected onto the one of the metal film and the resin film is not smaller than 3 mm and not greater than 10 mm.

3. A dicing apparatus comprising:
   a dicing unit forming a trench in a sample; and
   a processing unit including a nozzle removing at least part of the sample by injecting carbon dioxide particles onto the sample having the trench formed therein, the carbon dioxide particles being in solid state, wherein a mean particle size of the carbon dioxide particles is not smaller than 10 μm and not greater than 200 μm, and a spot diameter of the carbon dioxide particles on a surface of the sample when the carbon dioxide particles are injected onto the sample is not smaller than 3 mm and not greater than 10 mm.

4. The apparatus according to claim 3, wherein the dicing unit includes a blade forming the trench in the sample.

5. The apparatus according to claim 3, wherein the dicing unit includes a laser oscillator emitting laser light to form the trench in the sample.

* * * * *